(12) United States Patent
Ruff et al.

(10) Patent No.: US 9,710,227 B2
(45) Date of Patent: Jul. 18, 2017

(54) FORMATTING FLOATING POINT NUMBERS

(71) Applicant: John W. Ogilvie, Sandy, UT (US)

(72) Inventors: Eric J. Ruff, Provo, UT (US); John W. Ogilvie, Salt Lake City, UT (US)

(73) Assignee: John W. Ogilvie, Sandy, UT (US)

(*) Notice: Subject to any disclaimer, the term of this patent is extended or adjusted under 35 U.S.C. 154(b) by 222 days.

(21) Appl. No.: 14/726,535

(22) Filed: May 31, 2015

(65) Prior Publication Data

US 2015/0370536 A1 Dec. 24, 2015

Related U.S. Application Data

(63) Continuation-in-part of application No. 14/425,046, filed as application No. PCT/US2013/058410 on Sep. 6, 2013.

(60) Provisional application No. 62/014,638, filed on Jun. 19, 2014, provisional application No. 61/701,630, filed on Sep. 15, 2012, provisional application No. 61/716,325, filed on Oct. 19, 2012.

(51) Int. Cl.
*G06F 7/00* (2006.01)
*G06F 7/483* (2006.01)
*H03M 7/24* (2006.01)

(52) U.S. Cl.
CPC .............. *G06F 7/483* (2013.01); *H03M 7/24* (2013.01)

(58) Field of Classification Search
CPC .................................. G06F 7/483; H03M 7/24
USPC .......................................................... 708/204
See application file for complete search history.

(56) References Cited

U.S. PATENT DOCUMENTS

| | | | |
|---|---|---|---|
| 4,672,360 A | 6/1987 | Bradley et al. | |
| 4,719,450 A | 1/1988 | Yamauchi | |
| 5,257,215 A | 10/1993 | Poon | |
| 5,561,615 A | 10/1996 | Kuo et al. | |
| 5,657,259 A | 8/1997 | Davis et al. | |
| 5,719,569 A | 2/1998 | Saro | |
| 5,796,641 A | 8/1998 | Tu | |
| 5,831,878 A * | 11/1998 | Ishida | H03M 7/50 708/204 |
| 6,215,467 B1 | 4/2001 | Suga et al. | |
| 6,223,192 B1 * | 4/2001 | Oberman | G06F 7/53 708/270 |
| 6,282,554 B1 | 8/2001 | Abdallah et al. | |
| 6,437,715 B1 | 8/2002 | Cowlishaw | |
| 6,493,662 B1 | 12/2002 | Gillam | |
| 6,587,070 B2 | 7/2003 | Hallse | |
| 6,822,586 B2 | 11/2004 | Esbensen | |

(Continued)

OTHER PUBLICATIONS

"Binary number to decimal ASCII string conversion", from <<http://board.flatassembler.net/topic.php?t=3924>>, Aug. 6, 2005, 8 pages (please see copy submitted in parent U.S. Appl. No. 14/425,046, filed Mar. 1, 2015).

(Continued)

*Primary Examiner* — Tan V. Mai
(74) *Attorney, Agent, or Firm* — Ogilvie Law Firm

(57) ABSTRACT

Flexible high-speed generation and formatting of application-specified strings in floating point and related formats is available through table-based base conversion which may be integrated with custom formatting, and through printf-style functionality based on separate control string parsing and specialized format command sequence execution.

20 Claims, 5 Drawing Sheets

(56) References Cited

U.S. PATENT DOCUMENTS

| | | | |
|---|---|---|---|
| 6,907,435 B2 | 6/2005 | Coulson et al. | |
| 7,149,765 B2 | 12/2006 | Esbensen | |
| 7,215,264 B2 | 5/2007 | Salwan et al. | |
| 7,216,138 B2 | 5/2007 | Abdallah et al. | |
| 7,236,995 B2 | 6/2007 | Hinds | |
| 7,685,213 B2* | 3/2010 | Reynolds | G06F 17/215 708/204 |
| 7,685,214 B2 | 3/2010 | Chen et al. | |
| 7,707,233 B2 | 4/2010 | Cornea-Hasegan | |
| 7,797,360 B2 | 9/2010 | Kretzschmar et al. | |
| 7,921,144 B2 | 4/2011 | Hack | |
| 7,979,794 B2 | 7/2011 | Blakely et al. | |
| 8,078,658 B2 | 12/2011 | Iorio | |
| 8,164,492 B2 | 4/2012 | Esbensen | |
| 8,752,018 B2 | 6/2014 | Jones et al. | |
| 2002/0122060 A1 | 9/2002 | Markel | |
| 2006/0179091 A1 | 8/2006 | Carlough et al. | |
| 2008/0056253 A1 | 3/2008 | Minami et al. | |
| 2008/0059875 A1 | 3/2008 | Ishizaki et al. | |
| 2008/0122663 A1 | 5/2008 | Luo | |
| 2008/0263121 A1 | 10/2008 | Carlson et al. | |
| 2008/0270499 A1 | 10/2008 | Lundvall et al. | |
| 2008/0270507 A1 | 10/2008 | Lundvall et al. | |
| 2008/0301784 A1 | 12/2008 | Zhu et al. | |
| 2009/0210467 A1* | 8/2009 | Iorio | H03M 7/24 708/204 |
| 2010/0164867 A1 | 7/2010 | Lipovski | |
| 2011/0018976 A1 | 1/2011 | Park | |
| 2011/0234432 A1 | 9/2011 | Palmer et al. | |
| 2011/0258616 A1 | 10/2011 | Sollich | |
| 2012/0030375 A1 | 2/2012 | Schulenburg | |

OTHER PUBLICATIONS

"Dword to ascii, ascii to dword", from <<http://board.flatassembler.net/topic.php?t=15077>>, Feb. 9, 2013, 21 pages total (please see copy submitted in parent U.S. Appl. No. 14/425,046, filed Mar. 1, 2015).
"Multiplication in x86 OpenCI kernels", from <<http://devgurus.amd.com/thread/159531>>, Jul. 30, 2012, 2 pages (please see copy submitted in parent U.S. Appl. No. 14/425,046, filed Mar. 1, 2015).
"Useless SSE instructions", from <<http://www.mersenneforum.org/showthread.php?t=11516>>, Feb. 20, 2009, 10 pages total (please see copy submitted in parent U.S. Appl. No. 14/425,046, filed Mar. 1, 2015).
Daniel Lemire, "Data alignment for speed: myth or reality?", from <<http://lemire.me/blog/archives/2012/05/31/data-alignment-for-speed-myth-or-reality/>>, May 31, 2012, 8 pages (please see copy submitted in parent U.S. Appl. No. 14/425,046, filed Mar. 1, 2015).
"Diary of an x264 Developer", from <<http://x264dev.multimedia.cx/archives/8>>, May 2, 2008, 3 pages (please see copy submitted in parent U.S. Appl. No. 14/425,046, filed Mar. 1, 2015).
"Aligned vs. unaligned memory access", from <<http://www.alexonlinux.com/aligned-vs-unaligned-memory-access>>, Jun. 3, 2008, 11 pages (please see copy submitted in parent U.S. Appl. No. 14/425,046, filed Mar. 1, 2015).
"Memory alignment on a 32-bit Intel processor", from <<http://stackoverflow.com/questions/1054657/memory-alignment-on-a-32-bit-intel-processor>>, Jun. 28, 2009, 3 pages (please see copy submitted in parent U.S. Appl. No. 14/425,046, filed Mar. 1, 2015).
"Cache/page lines and LDDQU", from <<https://software.intel.com/en-us/forums/topic/304126>>, Nov. 18, 2007, 6 pages (please see copy submitted in parent U.S. Appl. No. 14/425,046, filed Mar. 1, 2015).
Jan Wassenberg, "Efficient Algorithms for Large-Scale Image Analysis", search result excerpt from <<http://books.google.com/books?id=XxNpa9axOXYC&pg=PA147&dq=PA147&dq=cpu+cache+line+splits&source=bl&ots=UbKZCN35ys&sig=jW8Wz24Tnmnw3OIJG4IABspOrRE&hl=en&sa=X&ei=fN3_U8fFL8K3iwLI-YHoDQ&ved=0CHYQ6AEwCQ#v=onepage&q=cpu%20cache%20line%20splits&f=false>>, Mar. 8, 2012, 2 pages (please see copy submitted in parent U.S. Appl. No. 14/425,046, filed Mar. 1, 2015).
"Optimization manuals", from <<http://www.agner.org/optimize/#manuals>>, no later than Aug. 30, 2014, 6 pages (please see copy submitted in parent U.S. Appl. No. 14/425,046, filed Mar. 1, 2015).
Agner Fog, "Optimizing subroutines in assembly language: An optimization guide for x86 platforms", from <<http://www.agner.org/optimize/optimizing_assembly.pdf>>, Copyright © 1996-2014, 164 pages (please see copy submitted in parent U.S. Appl. No. 14/425,046, filed Mar. 1, 2015).
Agner Fog, "The microarchitecture of Intel, AMD and VIA CPUs: An optimization guide for assembly programmers and compiler makers", from <<http://www.agner.org/optimize/microarchitecture.pdf>>, Copyright © 1996-2014, 205 pages (please see copy submitted in parent U.S. Appl. No. 14/425,046, filed Mar. 1, 2015).
"How to parse space-separated floats in C++ quickly?", from <<http://stackoverflow.com/questions/17465061/how-to-parse-space-separated-floats-in-c-quickly/17479702#17479702>>, Jul. 4, 2013, 8 pages (please see copy submitted in parent U.S. Appl. No. 14/425,046, filed Mar. 1, 2015).
"Parsing a Template String—The GNU C Library", retrieved at <<http://www.gnu.org/software/libc/manual/html_node/Parsing-a-Template-String.html#Parsing-a-Template-String>>, copyright 1993-2012, 2 pages (please see copy submitted in parent U.S. Appl. No. 14/425,046, filed Mar. 1, 2015).
"Customizing Printf—The GNU C Library", retrieved at <<http://www.gnu.org/software/libc/manual/html_node/Customizing-Printf.html>>, copyright 1993-2012, 1 page (please see copy submitted in parent U.S. Appl. No. 14/425,046, filed Mar. 1, 2015).
James Antill, "Vstr documentation—overview", retrieved at <<http://www.and.org/vstr/#cust-fmt>>, Mar. 6, 2006, 8 pages (please see copy submitted in parent U.S. Appl. No. 14/425,046, filed Mar. 1, 2015).
"Flat assembler—View topic—printf macro for display message", retrieved at <<http://board.flatassembler.net/topic.php?t=12849>>, Feb. 24, 2011, 3 pages (please see copy submitted in parent U.S. Appl. No. 14/425,046, filed Mar. 1, 2015).
"Printf(3)—Linux manual page", retrieved at <<http://www.kernel.org/doc/man-pages/online/pages/nnan3/sprintf.3.html>>, Dec. 3, 2010, 7 pages (please see copy submitted in parent U.S. Appl. No. 14/425,046, filed Mar. 1, 2015).
"Glibc strlen source", retrieved at <<http://sources.redhat.com/cgi-bin/cvsweb.cgi/libc/sysdeps/generic/Attic/strlen.c.diff?r1=1.1&r2=1.2&cvsroot=glibc>>, 1991-1992, 1 page (please see copy submitted in parent U.S. Appl. No. 14/425,046, filed Mar. 1, 2015).
Peter Kankowski, "Table-driven approach", retrieved at <<http://www.strchr.com/table-driven>>, 2009, 9 pages (please see copy submitted in parent U.S. Appl. No. 14/425,046, filed Mar. 1, 2015).
"Sourceware—glibc-bugs—[Bug libc/5807] New: strlen() not effective", retrieved at <<http://sourceware-org.1504.n7.nabble.com/Bug-libc-5807-New-strlen-not-effective-td24867.html>>, Feb. 28, 2008, 4 pages (please see copy submitted in parent U.S. Appl. No. 14/425,046, filed Mar. 1, 2015).
"/private/tmp/glibc-2.5/string/strlen.c.html", retrieved at <<http://tsunanet.net/~tsuna/strlen.c.html>>, Copyright (C) 1991, 1993, 1997, 2000, 2003, 3 pages (please see copy submitted in parent U.S. Appl. No. 14/425,046, filed Mar. 1, 2015).
"How to calculate the length of a string in C efficiently?—Stack Overflow", retrieved at <<http://stackoverflow.com/questions/2070566/how-to-calculate-the-length-of-a-string-in-c-efficiently>>, Jan. 15, 2010, 5 pages (please see copy submitted in parent U.S. Appl. No. 14/425,046, filed Mar. 1, 2015).
"FASMLIB", retrieved at <<http://fasmlib.x86asm.net/>>, no later than Dec. 9, 2012, 1 page (please see copy submitted in parent U.S. Appl. No. 14/425,046, filed Mar. 1, 2015).
"Flat assembler—View topic—fast strlen", retrieved at <<http://board.flatassembler.net/topic.php?p=70581>>, Oct. 12, 2007, 7 pages (please see copy submitted in parent U.S. Appl. No. 14/425,046, filed Mar. 1, 2015).

(56) References Cited

OTHER PUBLICATIONS

Paul Hsieh, "Paul Hsieh's Assembly Lab", retrieved at <<http://www.azillionmonkeys.com/qed/asmexample.html,>>, Copyright 1998-2004, 27 pages (please see copy submitted in parent U.S. Appl. No. 14/425,046, filed Mar. 1, 2015).
Dmitry Kostjuchenko, "SSE2 optimised strlen—strchr.com", retrieved at <<http://www.strchr.com/sse2_optimised_strlen?allcomments=1>>, 2009, 13 pages (please see copy submitted in parent U.S. Appl. No. 14/425,046, filed Mar. 1, 2015).
J .T. Conklin, "$OpenBSD: strlen.S,v", retrieved at <<http://www.openbsd.org/cgi-bin/cvsweb/src/lib/libc/arch/i386/string/Attic/strlen.S?rev=1.3;content-type=text%2Fplain>>, Aug. 7, 2005, 1 page (please see copy submitted in parent U.S. Appl. No. 14/425,046, filed Mar. 1, 2015).
J.T. Conklin, Frank van der Linden, "$OpenBSD: strlen.S,v", retrieved at <<http://www.openbsd.org/cgi-bin/cvsweb/src/lib/libc/arch/amd64/string/Attic/strlen.S?rev=1.1;content-type=text%2Fplain>>, Jan. 28, 2004, 1 page (please see copy submitted in parent U.S. Appl. No. 14/425,046, filed Mar. 1, 2015).
G. Adam Stanislav, "Finding a String Length in Assembly Language", retrieved at <<http://www.int80h.org/strlen/>>, copyright 2000, 3 pages (please see copy submitted in parent U.S. Appl. No. 14/425,046, filed Mar. 1, 2015).
"Glibc's strlen implementation: Probably not what you'd guess | Hacker News", retrieved at <<http://news.ycombinator.com/item?id=510326>>, 2008, 10 pages (please see copy submitted in parent U.S. Appl. No. 14/425,046, filed Mar. 1, 2015).
"Optimize Options—Using the GNU Compiler Collection (GCC)", retrieved at <<http://gcc.gnu.org/onlinedocs/gcc-4.1.1/gcc/Optimize-Options.html>>, no later than Dec. 9, 2012, 22 pages (please see copy submitted in parent U.S. Appl. No. 14/425,046, filed Mar. 1, 2015).
"Ideone.com_Online C++ Compiler & Debugging Tool", retrieved at <<http://ideone.com/VpKO3>>, 2010, 2 pages (please see copy submitted in parent U.S. Appl. No. 14/425,046, filed Mar. 1, 2015).
"C++ performance challenge_integer to std_string conversion—Stack Overflow", retrieved at <<http://stackoverflow.com/questions/4351371/c-performance-challenge-integer-to-stdstring-conversion>>, Dec. 4, 2010, 9 pages (please see copy submitted in parent U.S. Appl. No. 14/425,046, filed Mar. 1, 2015).
"Flat assembler—View topic—Convert Floating Point Number To String", retrieved at <<http://board.flatassembler.net/topic.php?t=14589&postdays=0&postorder=asc&start=20>>, Sep. 18, 2012, 3 pages (please see copy submitted in parent U.S. Appl. No. 14/425,046, filed Mar. 1, 2015).
"Flat assembler—View topic—Convert Floating Point Number To String", retrieved at <<http://board.flatassembler.net/topic.php?t=14589>>, Sep. 14, 2012, 6 pages (please see copy submitted in parent U.S. Appl. No. 14/425,046, filed Mar. 1, 2015).
"Flat assembler—View topic—Fastest base64 encoding (null terminated strings)", retrieved at <<http://board.flatassembler.net/topic.php?t=3063>>, Feb. 12, 2005, 10 pages (please see copy submitted in parent U.S. Appl. No. 14/425,046, filed Mar. 1, 2015).
Dan Rollins, "Fast Base64 Encode and Decode: base64, CryptoAPI, CryptBinaryToString, CryptStringToBinary, Base64Encode, Base64Decode", retrieved at <<http://www.experts-exchange.com/Programming/System/Windows_Programming/A_3216-Fast-Base64-Encode-and-Decode.html#c15564>>, Jun. 6, 2010, 16 pages (please see copy submitted in parent U.S. Appl. No. 14/425,046, filed Mar. 1, 2015).
S. Josefsson, "RFC 4648—The Base16, Base32, and Base64 Data Encodings", retrieved at <<http://tools.ietf.org/html/rfc4648>>, Oct. 2006, 13 pages (please see copy submitted in parent U.S. Appl. No. 14/425,046, filed Mar. 1, 2015).
James McCaffrey, "Cover Story: Understanding Base64 Encoding", retrieved at <<http://dotnet.sys-con.com/node/192527>>, Mar. 19, 2006, 7 pages (please see copy submitted in parent U.S. Appl. No. 14/425,046, filed Mar. 1, 2015).

"Base64", retrieved at <<http://en.wikipedia.org/wiki/Base64>>, Nov. 27, 2012, 9 pages (please see copy submitted in parent U.S. Appl. No. 14/425,046, filed Mar. 1, 2015).
"Base64—What is the use of base 64 encoding?—Stack Overflow", retrieved at <<http://stackoverflow.com/questions/201479/what-is-the-use-of-base-64-encoding>>, Oct. 14, 2008, 6 pages (please see copy submitted in parent U.S. Appl. No. 14/425,046, filed Mar. 1, 2015).
Sherry Riter, "Blank Space HTML—How to Create and Use the Non-Breaking Space Code", retrieved at <<http://www.theredheadriter.com/2012/04/blank-space-html/>>, Apr. 14, 2012, 13 pages (please see copy submitted in parent U.S. Appl. No. 14/425,046, filed Mar. 1, 2015).
"Why is_br_an HTML element rather than an HTML entity_—Stack Overflow", retrieved at <<http://stackoverflow.com/questions/3488198/why-is-br-an-html-element-rather-than-an-html-entity>>, Aug. 15, 2010, 7 pages (please see copy submitted in parent U.S. Appl. No. 14/425,046, filed Mar. 1, 2015).
"Non-breaking space", retrieved at <<http://en.wikipedia.org/wiki/Non-breaking_space>>, Dec. 7, 2012, 3 pages (please see copy submitted in parent U.S. Appl. No. 14/425,046, filed Mar. 1, 2015).
"Convert spaces to quickly—Google Groups", retrieved at <<https://groups.google.com/forum/?fromgroups=#!topic/bbedit/ye0jGG4BKHU>>, Mar. 31, 2010, 1 page (please see copy submitted in parent U.S. Appl. No. 14/425,046, filed Mar. 1, 2015).
"FASMLIB (FASM Standard Library Project)", from <<http://board.flatassembler.net/topic.php?p=52747#52747>>, Feb. 9, 2007, 10 pages (please see copy submitted in parent U.S. Appl. No. 14/425,046, filed Mar. 1, 2015).
"Faster Printf Released on NuGet", from <<http://t0yv0.blogspot.com/2012/09/faster-printf-released-on-nuget.html>>, Sep. 14, 2012, 2 pages (please see copy submitted in parent U.S. Appl. No. 14/425,046, filed Mar. 1, 2015).
"FastFormat", from <<http://fastformat.sourceforge.net/>>, Jun. 22, 2010, 3 pages (please see copy submitted in parent U.S. Appl. No. 14/425,046, filed Mar. 1, 2015).
"C++ most efficient way to convert string to int (faster than atoi)", from <<http://stackoverflow.com/questions/16826422/c-most-efficient-way-to-convert-string-to-int-faster-than-atoi>>, May 30, 2013, 6 pages (please see copy submitted in parent U.S. Appl. No. 14/425,046, filed Mar. 1, 2015).
"Specializing atoi()", from <<https://tombarta.wordpress.com/2008/04/23/specializing-atoi/>>, Apr. 23, 2008, 3 pages (please see copy submitted in parent U.S. Appl. No. 14/425,046, filed Mar. 1, 2015).
"How to convert ascii to interger in masm", from <<http://www.masmforum.com/board/index.php?PHPSESSID=786dd40408172108b65a5a36b09c88c0&topic=16316.0>>, Mar. 25, 2011, 6 pages (please see copy submitted in parent U.S. Appl. No. 14/425,046, filed Mar. 1, 2015).
"C++ Convert String to Int Speed", from <<http://tinodidriksen.com/2010/02/16/cpp-convert-string-to-int-speed/>>, Apr. 15, 2010, 5 pages (please see copy submitted in parent U.S. Appl. No. 14/425,046, filed Mar. 1, 2015).
"Need code for a fast atoi replacement", from <<http://www.linuxmisc.com/9-unix-programmer/ac2ca40f81be2e8c.htm>>, Nov. 1, 2004, 10 pages (please see copy submitted in parent U.S. Appl. No. 14/425,046, filed Mar. 1, 2015).
"Implement atoi", from <<http://bytes.com/topic/c/answers/220099-implement-atoi>>, Nov. 14, 2005, 14 pages (please see copy submitted in parent U.S. Appl. No. 14/425,046, filed Mar. 1, 2015).
"Rapidjson", from <<https://code.google.com/p/rapidjson/wiki/Performance>>, Nov. 19, 2011, 4 pages (please see copy submitted in parent U.S. Appl. No. 14/425,046, filed Mar. 1, 2015).
"64bit integer conversion from string", from <<http://stackoverflow.com/questions/8223814/64bit-integer-conversion-from-string>>, Nov. 22, 2011, 2 pages (please see copy submitted in parent U.S. Appl. No. 14/425,046, filed Mar. 1, 2015).
"Convert ascii number to dec", from <<http://www.asmcommunity.net/forums/topic/?id=3817>>, Feb. 25, 2002, 5 pages (please see copy submitted in parent U.S. Appl. No. 14/425,046, filed Mar. 1, 2015).

(56) References Cited

OTHER PUBLICATIONS

"BitManipulation", from <<https://wiki.python.org/moin/BitManipulation>>, no later than Aug. 21, 2014, 10 pages (please see copy submitted in parent U.S. Appl. No. 14/425,046, filed Mar. 1, 2015).

"Browse—programming tips—fast hex to int", from <<http://www.davekb.com/browse_programming_tips:_fast_hex_to_int:txt>>, Nov. 25, 2010, 1 page (please see copy submitted in parent U.S. Appl. No. 14/425,046, filed Mar. 1, 2015).

"Converting int to hex number", from <<http://www.avrfreaks.net/forum/converting-int-hex-number?name=PNphpBB2&file=viewtopic&t=36517>>, Mar. 13, 2006, 10 pages (please see copy submitted in parent U.S. Appl. No. 14/425,046, filed Mar. 1, 2015).

"Best way to convert hexadecimal string to binary string?", from <<http://board.flatassembler.net/topic.php?p=84943>>, Nov. 16, 2008, 9 pages (please see copy submitted in parent U.S. Appl. No. 14/425,046, filed Mar. 1, 2015).

"How to convert Integer to a String?", from <<http://board.flatassembler.net/topic.php?p=119911>>, Sep. 28, 2010, 8 pages (please see copy submitted in parent U.S. Appl. No. 14/425,046, filed Mar. 1, 2015).

Douglas W. Jones, "Binary to Decimal Conversion in Limited Precision", from <<http://www.divms.uiowa.edu/~jones/bcd/decimal.html>>, 1999, 12 pages (please see copy submitted in parent U.S. Appl. No. 14/425,046, filed Mar. 1, 2015).

"Magic number", from <<http://en.wikipedia.org/wiki/Magic_number>>, Jul. 14, 2012, 1 page (please see copy submitted in parent U.S. Appl. No. 14/425,046, filed Mar. 1, 2015).

Russell H. Taylor, et al., "Medical Robotics and Computer-Integrated Surgery", from <<http://www.google.com/url?sa=t&rct=j&q=&esrc=s&source=web&cd=3&ved=0CC0QFjAC&url=http%3A%2F%2Flink.springer.com%2Fcontent%2Fpdf%2F10.1007%252F978-3-540-30301-5_53.pdf&ei=IWr0VJrzHcjzoATb9IHYCw&usg=AFQjCNGvPjkA96rdDk0FQSHNoo2GYVqOgg&bvm=bv.87269000,d.cGU>>, 2001, 24 pages (please see copy submitted in parent U.S. Appl. No. 14/425,046, filed Mar. 1, 2015).

"Model of computation", from <<http://en.wikipedia.org/wiki/Model_of_computation>>, Mar. 11, 2012, 2 pages (please see copy submitted in parent U.S. Appl. No. 14/425,046, filed Mar. 1, 2015).

"One-time pad", from <<http://en.wikipedia.org/wiki/One-time_pad>>, Mar. 23, 2012, 12 pages (please see copy submitted in parent U.S. Appl. No. 14/425,046, filed Mar. 1, 2015).

"Output—MarcsHomepage", from <<http://www.marcsaric.de/index.php/Output>>, Sep. 17, 2006, 3 pages (please see copy submitted in parent U.S. Appl. No. 14/425,046, filed Mar. 1, 2015).

N. Pattabiraman, et al., "Computer Graphics in Real-time Docking with Energy Calculation and Minimization", Journal of Computational Chemistry, vol. 6, No. 5, 432-436 (1985), 5 pages (please see copy submitted in parent U.S. Appl. No. 14/425,046, filed Mar. 1, 2015).

Alois Kraus, "Performance Quiz: Fastest way to format time", from <<http://geekswithblogs.net/akraus1/archive/2006/04/23/76146.aspx>>, 2006, 26 pages (please see copy submitted in parent U.S. Appl. No. 14/425,046, filed Mar. 1, 2015).

"Printf format string", from <<http://en.wikipedia.org/wiki/Printf_format_string>>, Jun. 30, 2012, 8 pages (please see copy submitted in parent U.S. Appl. No. 14/425,046, filed Mar. 1, 2015).

"Process Controllers, Process Control Meters", from <<http://www.globalw.com/products/pc320.html>>, 2011, 4 pages (please see copy submitted in parent U.S. Appl. No. 14/425,046, filed Mar. 1, 2015).

"Programmable logic controller", from <<http://en.wikipedia.org/wiki/Programmable_logic_controller>>, Jul. 16, 2012, 8 pages (please see copy submitted in parent U.S. Appl. No. 14/425,046, filed Mar. 1, 2015).

"Qword to ascii conversion", from <<http://masm32.com/board/index.php?topic=221.0>>, Jun. 6, 2012, 7 pages (please see copy submitted in parent U.S. Appl. No. 14/425,046, filed Mar. 1, 2015).

"Reinterpret_cast Operator (C++)", from <<http://msdn.microsoft.com/en-us/library/e0w9f63b(v=vs.80).aspx>>, no later than Jul. 16, 2012, 2 pages (please see copy submitted in parent U.S. Appl. No. 14/425,046, filed Mar. 1, 2015).

"Robotic surgery", from <<http://en.wikipedia.org/wiki/Medical_robot>>, Jul. 17, 2012, 10 pages (please see copy submitted in parent U.S. Appl. No. 14/425,046, filed Mar. 1, 2015).

"South Asian numbering system", from <<http://en.wikipedia.org/wiki/South_Asian_numbering_system>>, Jul. 5, 2012, 4 pages (please see copy submitted in parent U.S. Appl. No. 14/425,046, filed Mar. 1, 2015).

"Telemetry", from <<http://en.wikipedia.org/wiki/Telemetry>>, Jun. 29, 2012, 6 pages (please see copy submitted in parent U.S. Appl. No. 14/425,046, filed Mar. 1, 2015).

Andrew Thall, "Extended-Precision Floating-Point Numbers for GPU Computation", from <<http://andrewthall.org/papers/df64_qf128.pdf>>, Tech. Rep. CIM-007-01, Mar. 15, 2007, 12 pages (please see copy submitted in parent U.S. Appl. No. 14/425,046, filed Mar. 1, 2015).

Jim Loy, "The Famous Beale Cipher", from <<http://www.jimloy.com/puzz/beale.htm>>, 2001, 3 pages (please see copy submitted in parent U.S. Appl. No. 14/425,046, filed Mar. 1, 2015).

"Ultrasound", from <<http://en.wikipedia.org/wiki/Ultrasound>>, Jul. 19, 2012, 12 pages (please see copy submitted in parent U.S. Appl. No. 14/425,046, filed Mar. 1, 2015).

"What is managed/unmanaged code in C#?", from <<http://stackoverflow.com/questions/334326/what-is-managed-unmanaged-code-in-c>>, Dec. 2, 2008, 4 pages (please see copy submitted in parent U.S. Appl. No. 14/425,046, filed Mar. 1, 2015).

"Worldometers—real time world statistics", from <<http://www.worldometers.info/>>, Jul. 17, 2012, 5 pages (please see copy submitted in parent U.S. Appl. No. 14/425,046, filed Mar. 1, 2015).

Bing Wu, et al., "Psychophysical Evaluation of In-Situ Ultrasound Visualization", IEEE Transactions on Visualization and Computer Graphics, vol. 11, No. 6, Nov./Dec. 2005, 10 pages (please see copy submitted in parent U.S. Appl. No. 14/425,046, filed Mar. 1, 2015).

"c++ Fastest way to convert int to string of char?", retrieved at <<http://ubuntuforums.org/archive/index.php/t-1728134.htm>>, Apr. 13, 2011, 11 pages (please see copy submitted in parent U.S. Appl. No. 14/425,046, filed Mar. 1, 2015).

William D. Clinger, "How to Read Floating Point Numbers Accurately", retrieved at <<http://www.cesura17.net/~will/Professional/Research/Papers/howtoread.pdf>>, 2004, 9 pages.

Rick Regan, "Why Powers of Ten Up to 101^22 Are Exact As Doubles", retrieved at <<http://www.exploringbinary.com/why-powers-of-ten-up-to-10-to-the-22-are-exact-as-doubles/>>, Aug. 11, 2011, 4 pages (please see copy submitted in parent U.S. Appl. No. 14/425,046, filed Mar. 1, 2015).

"Boost Format library", retrieved at <<http://www.boost.org/doc/libs/1_50_0/libs/format/>>, Dec. 2, 2006, 1 page (please see copy submitted in parent U.S. Appl. No. 14/425,046, filed Mar. 1, 2015).

"Fun a'la Alois", retrieved at <<http://geekswithblogs.net/gyoung/archive/2006/04/24/76187.aspx>>, Apr. 24, 2006, 4 pages (please see copy submitted in parent U.S. Appl. No. 14/425,046, filed Mar. 1, 2015).

"Branch table", retrieved at <<http://en.wikipedia.org/wiki/Branch_table#Jump_table_example_in_C>>, Nov. 22, 2012, 5 pages (please see copy submitted in parent U.S. Appl. No. 14/425,046, filed Mar. 1, 2015).

"C—Is 'switch' faster than 'if'?", retrieved at <<http://stackoverflow.com/questions/6805026/is-switch-faster-than-if>>, Jul. 24, 2011, 11 pages (please see copy submitted in parent U.S. Appl. No. 14/425,046, filed Mar. 1, 2015).

"Optimization of switch statements on i386", retrieved at <<http://old.nabble.com/optimization-of-switch-statements-on-i386-to15366926.html#a15367662>>, 2008, 10 pages (please see copy submitted in parent U.S. Appl. No. 14/425,046, filed Mar. 1, 2015).

"Switch optimization for many cases guarantees equal access time for any case?", retrieved at <<http://stackoverflow.com/questions/

(56) References Cited

OTHER PUBLICATIONS

2129718/switch-optimization-for-many-cases-guarantees-equal-access-time-for-any-case>>, Jan. 25, 2010, 4 pages (please see copy submitted in parent U.S. Appl. No. 14/425,046, filed Mar. 1, 2015).
"Pantheios: The C++ Logging SweetSpot", retrieved at <<http://www.pantheios.org/performance.html>>, copyright 1999-2010, 10 pages (please see copy submitted in parent U.S. Appl. No. 14/425,046, filed Mar. 1, 2015).
ACCU :: An Introduction to FastFormat, retrieved at <<http://accu.org/index.php/journals/ . . . >>, 2009, 97 pages (please see copy submitted in parent U.S. Appl. No. 14/425,046, filed Mar. 1, 2015).
"IntelliFactory / printf", retrieved at <<https://bitbucket.org/IntelliFactory/printf>>, Sep. 14, 2012, 2 pages (please see copy submitted in parent U.S. Appl. No. 14/425,046, filed Mar. 1, 2015).
Arseny Kapoulkine, "fastprintf", retrieved at <<http://hg.zeuxcg.org/fastprintf>>, Sep. 2, 2011, 2 pages (please see copy submitted in parent U.S. Appl. No. 14/425,046, filed Mar. 1, 2015).
Anton Tayanovskyy, "Faster Printf Released on NuGet", retrieved at <<http://t0yv0.blogspot.com/2012/09/faster-printf-released-on-nuget.html>>, Sep. 14, 2012, 2 pages (please see copy submitted in parent U.S. Appl. No. 14/425,046, filed Mar. 1, 2015).
"C++—How can I improve/replace sprintf, which I've measured to be a performance hotspot?", retrieved at <<http://stackoverflow.com/questions/271971/how-can-i-improve-replace-sprintf-which-ive-measured-to-be-a-performance-hotsp>>, Nov. 7, 2008, 7 pages (please see copy submitted in parent U.S. Appl. No. 14/425,046, filed Mar. 1, 2015).
"Lava3 Printf", retrieved at <<http://sharkysoft.com/software/java/lava3/printf/>>, copyright 1997-2006, 1 page (please see copy submitted in parent U.S. Appl. No. 14/425,046, filed Mar. 1, 2015).
"Should I use printf in my C++ code?—Stack Overflow", retrieved at <<http://stackoverflow.com/questions/2017489/should-i-use-printf-in-my-c-code>>, Jan. 7, 2010, 11 pages (please see copy submitted in parent U.S. Appl. No. 14/425,046, filed Mar. 1, 2015).
"Comparing the performance of a sequence of several generators—1.46.1", retrieved at <<http://www.boost.org/doc/libs/1_46_1/libs/spirit/doc/html/spirit/karma/performance_measurements/numeric_performance/format_performance.html>>, copyright 2001-2011, 2 pages (please see copy submitted in parent U.S. Appl. No. 14/425,046, filed Mar. 1, 2015).
"Printf() vs cout: function versus stream—C++ Forum", retrieved at <<http://www.cplusplus.com/forum/lounge/48796/>>, Aug. 16, 2011, 3 pages (please see copy submitted in parent U.S. Appl. No. 14/425,046, filed Mar. 1, 2015).
"C++—std::string formatting like sprintf—Stack Overflow", retrieved at <<http://stackoverflow.com/questions/2342162/stdstring-formatting-like-sprintf>>, Feb. 26, 2010, 6 pages (please see copy submitted in parent U.S. Appl. No. 14/425,046, filed Mar. 1, 2015).
"Java—Fast conversion of bytel containing ascii string to int/double/date, etc. without new String—Stack Overflow", retrieved at <<http://stackoverflow.com/questions/9172402/fast-conversion-of-byte-containing-ascii-string-to-int-double-date-etc-witho>>, Feb. 7, 2012, 4 pages (please see copy submitted in parent U.S. Appl. No. 14/425,046, filed Mar. 1, 2015).
"Converting ascii to integer without using atoi", retrieved at <<http://cboard.cprogramming.com/cplusplus-programming/63643-converting-ascii-integer-without-using-atoi.html>>, Mar. 29, 2005, 10 pages (please see copy submitted in parent U.S. Appl. No. 14/425,046, filed Mar. 1, 2015).
"C++ Fastest way to convert int to string of char?—p. 3—Ubuntu Forums", retrieved at <<http://ubuntuforums.org/showthread.php?t=1728134&page=3>>, Apr. 14, 2011, 6 pages (please see copy submitted in parent U.S. Appl. No. 14/425,046, filed Mar. 1, 2015).
"Dave's Brain—Browse—programming tips—fast ascii to int", retrieved at <<http://www.davekb.com/browse_programming_tips:fast_ascii_to_int:txt>>, Feb. 4, 2008, 1 page (please see copy submitted in parent U.S. Appl. No. 14/425,046, filed Mar. 1, 2015).
Karl Seguin, "Fast string to integer conversion", retrieved at <<http://codebetter.com/karlseguin/2007/01/15/fast-string-to-integer-conversion/>>, Jan. 15, 2007, 5 pages (please see copy submitted in parent U.S. Appl. No. 14/425,046, filed Mar. 1, 2015).
"Predefined Printf Handlers—The GNU C Library", retrieved at <<http://www.gnu.org/software/libc/manual/html_node/Predefined-Printf-Handlers.html#Predefined-Printf-Handlers>>, copyright 1993-2012, 1 page (please see copy submitted in parent U.S. Appl. No. 14/425,046, filed Mar. 1, 2015).
"Printf Extension Example—The GNU C Library", retrieved at <<http://www.gnu.org/software/libc/manual/html_node/Printf-Extension-Example.html#Printf-Extension-Example>>, copyright 1993-2012, 2 pages (please see copy submitted in parent U.S. Appl. No. 14/425,046, filed Mar. 1, 2015).
"Conversion Specifier Options—The GNU C Library", retrieved at <<http://www.gnu.org/software/libc/manual/html_node/Conversion-Specifier-Options.html#Conversion-Specifier-Options>>, copyright 1993-2012, 2 pages (please see copy submitted in parent U.S. Appl. No. 14/425,046, filed Mar. 1, 2015).
Peter Seiderer, "About GCC printf optimization", from <<http://www.ciselant.de/projects/gcc_printf/gcc_printf.html>>, Nov. 30, 2005, 9 pages (please see copy submitted in parent U.S. Appl. No. 14/425,046, filed Mar. 1, 2015).
Eric J. Ruff, Extem DL code, from <<C:\Users\test\Documents\ASM Projects\Research\ExternDLLasm>>, Feb. 24, 2011, 16 pages (please see copy submitted in parent U.S. Appl. No. 14/425,046, filed Mar. 1, 2015).
"Hello world program examples", from <<http://en.wikipedia.org/wiki/Hello_world_program_examples>>, Oct. 8, 2012, 21 pages (please see copy submitted in parent U.S. Appl. No. 14/425,046, filed Mar. 1, 2015).
MASM str function source code, 2006, 3 pages (please see copy submitted in parent U.S. Appl. No. 14/425,046, filed Mar. 1, 2015).
Microsoft Visual Studio(r) C++ str function source code, 2007, 17 pages (please see copy submitted in parent U.S. Appl. No. 14/425,046, filed Mar. 1, 2015).
"New printf interface", from <<https://groups.google.com/forum/?fromgroups>>, Aug. 3, 2012, 36 pages (please see copy submitted in parent U.S. Appl. No. 14/425,046, filed Mar. 1, 2015).
"Optimizing Printf for Java Calls", from <<http://sharkysoft.com/archive/printf/docs/javadocs/lava/clib/stdio/doc-files/optimize.htm>>, © 1998-2001, 4 pages (please see copy submitted in parent U.S. Appl. No. 14/425,046, filed Mar. 1, 2015).
"Printf format string", from <<http://en.wikipedia.org/wiki/Printf_format_string>>, Aug. 27, 2012, 8 pages (please see copy submitted in parent U.S. Appl. No. 14/425,046, filed Mar. 1, 2015).
"Printf Optimization", from <<http://www.compileroptimizations.com/category/printf_optimization.htm>>, 2011, 1 page (please see copy submitted in parent U.S. Appl. No. 14/425,046, filed Mar. 1, 2015).
"Printf optimization", from <<http://www.microchip.com/forums/m247199.aspx>>, 2007, 5 pages (please see copy submitted in parent U.S. Appl. No. 14/425,046, filed Mar. 1, 2015).
"Review of my own C++ Format function", from <<http://codereview.stackexchange.com/questions/2182/review-of-my-own-c-format-function-alternative-to-sprintf-iostreams-and-b>>, Apr. 30, 2011 (please see copy submitted in parent U.S. Appl. No. 14/425,046, filed Mar. 1, 2015).
MASM32 strlen function source code, 2006, 2 pages (please see copy submitted in parent U.S. Appl. No. 14/425,046, filed Mar. 1, 2015).
MASM32 szlen function source code, 2006, 2 pages (please see copy submitted in parent U.S. Appl. No. 14/425,046, filed Mar. 1, 2015).
Microsoft Visual Studio(r) C++ str—functions source code, 2007, 20 pages (please see copy submitted in parent U.S. Appl. No. 14/425,046, filed Mar. 1, 2015).
Eric J. Ruff, QKLIBRARY.DLL, from <<C:\Users\test\Documents\ASM Projects\Research\Test.asm>>, Copyright 2008-2011, 41 pages (please see copy submitted in parent U.S. Appl. No. 14/425,046, filed Mar. 1, 2015).
Eric J. Ruff, TestDLL.DLL, from <<C:544 Users\test\Documents\ASM Projects\Research\TestDLLasm>>,

(56) References Cited

OTHER PUBLICATIONS

Copyright 2011, 39 pages (please see copy submitted in parent U.S. Appl. No. 14/425,046, filed Mar. 1, 2015).
Don Morgan, "Numerical Methods: Real-Time and Embedded Systems Programming", ISBN 1-55851-232-2, 1992, 512 pages (please see copy submitted in parent U.S. Appl. No. 14/425,046, filed Mar. 1, 2015).
"64-bit", from <<http://en.wikipedia.org/wiki/64-bit>>, Jul. 12, 2012, 11 pages (please see copy submitted in parent U.S. Appl. No. 14/425,046, filed Mar. 1, 2015).
Tomas Akenine-Möller, et al., "Graphics Processing Units for Handhelds", vol. 96, IEEE No. 5, May 2008, Proceedings of the IEEE, pp. 779-789 (please see copy submitted in parent U.S. Appl. No. 14/425,046, filed Mar. 1, 2015).
"Analysis of algorithms", from <<http://en.wikipedia.org/wiki/Analysis_of_algorithms>>, Jul. 17, 2012, 6 pages (please see copy submitted in parent U.S. Appl. No. 14/425,046, filed Mar. 1, 2015).
"ASCII", from <<http://en.wikipedia.org/wiki/ASCII>>, Jul. 10, 2012, 12 pages (please see copy submitted in parent U.S. Appl. No. 14/425,046, filed Mar. 1, 2015).
"Integer division on ARM", from <<http://stackoverflow.com/questions/8348030/integer-division-on-arm>>, Dec. 1, 2011, 3 pages (please see copy submitted in parent U.S. Appl. No. 14/425,046, filed Mar. 1, 2015).
Rick Regan, "Base Conversion in PHP Using BCMath", from <<http://www.exploringbinary.com/base-conversion-in-php-using-bcmath/>>, Apr. 11, 2009, 5 pages (please see copy submitted in parent U.S. Appl. No. 14/425,046, filed Mar. 1, 2015).
Jim Blowers, "Binary and Hexadecimal Numbers—quick conversion", from <<http://jimvb.home.mindspring.com/binary.htm>>, no later than Sep. 18, 2012, 5 pages (please see copy submitted in parent U.S. Appl. No. 14/425,046, filed Mar. 1, 2015).
"Binary numeral system", from <<http://en.wikipedia.org/wiki/Binary_numeral_system>>, Jul. 14, 2012, 13 pages (please see copy submitted in parent U.S. Appl. No. 14/425,046, filed Mar. 1, 2015).
"Binary scaling", from <<http://en.wikipedia.org/wiki/Binary_scaling>>, Jan. 29, 2012, 3 pages (please see copy submitted in parent U.S. Appl. No. 14/425,046, filed Mar. 1, 2015).
"Binary to BCD Converter", from <<http://www.engr.udayton.edu/faculty/jloomis/ece314/notes/devices/ . . . >>, Jan. 4, 2004, 4 pages (please see copy submitted in parent U.S. Appl. No. 14/425,046, filed Mar. 1, 2015).
"Binary-coded decimal", from <<http://en.wikipedia.org/wiki/Binary-coded_decimal>>, Jul. 3, 2012, 11 pages (please see copy submitted in parent U.S. Appl. No. 14/425,046, filed Mar. 1, 2015).
"C/C++: Writing printf-style Functions", from <<http://tdistler.com/2010/01/11/cc-writing-printf-style-functions>>, Jan. 11, 2010, 3 pages (please see copy submitted in parent U.S. Appl. No. 14/425,046, filed Mar. 1, 2015).
"C++ General: How is floating point representated?", from <<http://forums.codeguru.com/showthread.php?323835-C-General-How-is-floating-point-representated>>, Jul. 23, 2005, 6 pages (please see copy submitted in parent U.S. Appl. No. 14/425,046, filed Mar. 1, 2015).
"Computational complexity theory", from <<http://en.wikipedia.org/wiki/Computational_complexity_theory>>, Jul. 23, 2012, 10 pages (please see copy submitted in parent U.S. Appl. No. 14/425,046, filed Mar. 1, 2015).
"Computer number format", from <<http://en.wikipedia.org/wiki/Computer_number_format>>, Jun. 20, 2012, 7 pages (please see copy submitted in parent U.S. Appl. No. 14/425,046, filed Mar. 1, 2015).
"Coot (program)", from <<http://en.wikipedia.org/wiki/Coot_(program)>>, Jan. 20, 2012, 4 pages (please see copy submitted in parent U.S. Appl. No. 14/425,046, filed Mar. 1, 2015).
Jonah Lehrer, "Cracking the Scratch Lottery Code", from <<http://www.wired.com/magazine/2011/01/ff_lottery/all/1>>, Jan. 31, 2011, 23 pages (please see copy submitted in parent U.S. Appl. No. 14/425,046, filed Mar. 1, 2015).
"Data logger", from <<http://en.wikipedia.org/wiki/Data_logger>>, Jun. 7, 2012, 5 pages (please see copy submitted in parent U.S. Appl. No. 14/425,046, filed Mar. 1, 2015).
"Decimal Arithmetic FAQ", from <<http://speleotrove.com/decimal/decifaq1.html>>, 2007, 7 pages (please see copy submitted in parent U.S. Appl. No. 14/425,046, filed Mar. 1, 2015).
"Decimal mark", from <<http://en.wikipedia.org/wiki/Decimal_mark>>, Jul. 16, 2012, 6 pages (please see copy submitted in parent U.S. Appl. No. 14/425,046, filed Mar. 1, 2015).
"Decimal64 floating-point format", from <<http://en.wikipedia.org/wiki/Decimal64_floating-point_format>>, Feb. 19, 2011, 4 pages (please see copy submitted in parent U.S. Appl. No. 14/425,046, filed Mar. 1, 2015).
"Densely packed decimal", from <<http://en.wikipedia.org/wiki/Densely_packed_decimal>>, Jan. 27, 2012, 3 pages (please see copy submitted in parent U.S. Appl. No. 14/425,046, filed Mar. 1, 2015).
"Embedded system", from <<http://en.wikipedia.org/wiki/Embedded_system>>, Jul. 13, 2012, 11 pages (please see copy submitted in parent U.S. Appl. No. 14/425,046, filed Mar. 1, 2015).
"Extremly fast printf() type replacement", from <<http://www.delphigroups.info/3/5/128104.html>>, Apr. 19, 2005, 7 pages (please see copy submitted in parent U.S. Appl. No. 14/425,046, filed Mar. 1, 2015).
"Floating point", from <<http://en.wikipedia.org/wiki/Floating_point>>, Jul. 10, 2012, 20 pages (please see copy submitted in parent U.S. Appl. No. 14/425,046, filed Mar. 1, 2015).
"Floating Point Currency", from <<http://c2.com/cgi/wiki?FloatingPointCurrency>>, Aug. 14, 2010, 3 pages (please see copy submitted in parent U.S. Appl. No. 14/425,046, filed Mar. 1, 2015).
"Four color theorem", from <<http://en.wikipedia.org/wiki/Four_color_theorem>>, Jun. 22, 2012, 9 pages (please see copy submitted in parent U.S. Appl. No. 14/425,046, filed Mar. 1, 2015).
"General Decimal Arithmetic", from <<http://speleotrove.com/decimal/>>, Copyright 1997, 2008 by International Business Machines Corporation, Copyright © Mike Cowlishaw 1981, 2012, 8 pages (please see copy submitted in parent U.S. Appl. No. 14/425,046, filed Mar. 1, 2015).
"Globalization Step-by-Step: Number Formatting", from <<http://msdn.microsoft.com/en-us/goglobal/bb688127.aspx>>, © 2012, 5 pages (please see copy submitted in parent U.S. Appl. No. 14/425,046, filed Mar. 1, 2015).
"Google AdWords: Keyword Tool", from <<https://adwords.google.com/ . . . >>, Sep. 18, 2012, 8 pages (please see copy submitted in parent U.S. Appl. No. 14/425,046, filed Mar. 1, 2015).
"HackageDB: double-conversion-0.2.0.5", from <<http://hackage.haskell.org/package/double-conversion>>, Aug. 25, 2012, 1 page (please see copy submitted in parent U.S. Appl. No. 14/425,046, filed Mar. 1, 2015).
"Intel BCD opcode", from <<http://en.wikipedia.org/wiki/Intel_BCD_opcode>>, Apr. 1, 2012, 3 pages (please see copy submitted in parent U.S. Appl. No. 14/425,046, filed Mar. 1, 2015).
"Javascript—How could I display a crosshair cursor with x-y coordinates when hovering over an image?", from <<http://stackoverflow.com/questions/7526186/how-could-i-display-a-crosshair-cursor-with-x-y-coordinates-when-hovering-over-a>>, Sep. 23, 2011, 4 pages (please see copy submitted in parent U.S. Appl. No. 14/425,046, filed Mar. 1, 2015).
International Search Report and Written Opinion, PCT/US13/58410, mailed Mar. 21, 2014, 17 pages (please see copy submitted in parent U.S. Appl. No. 14/425,046, filed Mar. 1, 2015).
International Preliminary Report on Patentability, PCT/US13/58410, mailed Aug. 21, 2014, 9 pages (please see copy submitted in parent U.S. Appl. No. 14/425,046, filed Mar. 1, 2015).
International Search Report and Written Opinion, PCT/US14/22021, mailed Jul. 21, 2014, 20 pages (please see copy submitted in parent U.S. Appl. No. 14/425,046, filed Mar. 1, 2015).
International Preliminary Report on Patentability, PCT/US14/22021, mailed Feb. 4, 2015, 14 pages (please see copy submitted in parent U.S. Appl. No. 14/425,046, filed Mar. 1, 2015).

\* cited by examiner

Table of Some Suitable MagicNumbers

| Divisor | MagicNumber | # Bits | Shift | Max Input |
|---|---|---|---|---|
| These MagicNumbers are for 32-bit binary integers: | | | | |
| $10^1$ | 0x1999999a | 32 | 32 | $10^9$ |
| $10^1$ | 0xccccccccd | 32 | 35 | $(1 << 32) - 1$ |
| $10^2$ | 0x028f5c29 | 32 | 32 | $10^9$ |
| $10^2$ | 0x51eb851f | 32 | 37 | $(1 << 32) - 1$ |
| $10^3$ | 0x00418938 | 32 | 32 | $10^6$ |
| $10^3$ | 0x10624DD3 | 32 | 38 | $(1 << 32) - 1$ |
| $10^6$ | 0x431BDE83 | 32 | 50 | $10^9$ |
| $10^9$ | 0x1:12E0BE83 | 64 | 62 | $(1 << 32) - 1$ |
| These MagicNumbers are for 64-bit binary integers: | | | | |
| $10^9$ | 0x4:4b82fa0a | 64 | 64 | $19 * 10^9$ |
| $10^9$ | 0x89:0x705f4137 | 64 | 69 | $10^{12}$ |
| $10^9$ | 0x225c1:0x7d04dad3 | 64 | 79 | $10^{15}$ |
| $10^9$ | 0x112e0be8:0x26d694b3 | 64 | 90 | $10^{18}$ |
| $10^9$ | 0x1:0x12e0be82:0x6d694b2f | 96 | 94 | $(1 << 64) - 1$ |

Fig. 4

| Trip | Bit | Lowest Number | Procedure |
|---|---|---:|---|
| 1 | 0 | 1 | JmpTriplet1 |
| 1 | 1 | 2 | JmpTriplet1 |
| 1 | 2 | 4 | JmpTriplet1 |
| 1 | 3 | 8 | JmpTriplet1 |
| 1 | 4 | 16 | JmpTriplet1 |
| 1 | 5 | 32 | JmpTriplet1 |
| 1 | 6 | 64 | JmpTriplet1 |
| 1 | 7 | 128 | JmpTriplet1 |
| 1 | 8 | 256 | JmpTriplet1 |
| 2* | 9 | 512 | JmpTriplet2Chk |
| 2 | 10 | 1,024 | JmpTriplet2 |
| 2 | 11 | 2,048 | JmpTriplet2 |
| 2 | 12 | 4,096 | JmpTriplet2 |
| 2 | 13 | 8,192 | JmpTriplet2 |
| 2 | 14 | 16,384 | JmpTriplet2 |
| 2 | 15 | 32,768 | JmpTriplet2 |
| 2 | 16 | 65,536 | JmpTriplet2 |
| 2 | 17 | 131,072 | JmpTriplet2 |
| 2 | 18 | 262,144 | JmpTriplet2 |
| 3* | 19 | 524,288 | JmpTriplet3Chk |
| 3 | 20 | 1,048,576 | JmpTriplet3 |
| 3 | 21 | 2,097,152 | JmpTriplet3 |
| 3 | 22 | 4,194,304 | JmpTriplet3 |
| 3 | 23 | 8,388,608 | JmpTriplet3 |
| 3 | 24 | 16,777,216 | JmpTriplet3 |
| 3 | 25 | 33,554,432 | JmpTriplet3 |
| 3 | 26 | 67,108,864 | JmpTriplet3 |
| 3 | 27 | 134,217,728 | JmpTriplet3 |
| 3 | 28 | 268,435,456 | JmpTriplet3 |
| 4* | 29 | 536,870,912 | JmpTriplet4Chk |
| 4 | 30 | 1,073,741,824 | JmpTriplet4 |
| 4 | 31 | 2,147,483,648 | JmpTriplet4 |

Fig. 5

| Trip | Bit | Lowest Number | Procedure |
|------|-----|---------------|-----------|
| 4 | 32 | 4,294,967,296 | JmpTriplet4 |
| 4 | 33 | 8,589,934,592 | JmpTriplet4 |
| 4 | 34 | 17,179,869,184 | JmpTriplet4 |
| 4 | 35 | 34,359,738,368 | JmpTriplet4 |
| 4 | 36 | 68,719,476,736 | JmpTriplet4 |
| 4 | 37 | 137,438,953,472 | JmpTriplet4 |
| 4 | 38 | 274,877,906,944 | JmpTriplet4 |
| 5* | 39 | 549,755,813,888 | JmpTriplet5Chk |
| 5 | 40 | 1,099,511,627,776 | JmpTriplet5 |
| 5 | 41 | 2,199,023,255,552 | JmpTriplet5 |
| 5 | 42 | 4,398,046,511,104 | JmpTriplet5 |
| 5 | 43 | 8,796,093,022,208 | JmpTriplet5 |
| 5 | 44 | 17,592,186,044,416 | JmpTriplet5 |
| 5 | 45 | 35,184,372,088,832 | JmpTriplet5 |
| 5 | 46 | 70,368,744,177,664 | JmpTriplet5 |
| 5 | 47 | 140,737,488,355,328 | JmpTriplet5 |
| 5 | 48 | 281,474,976,710,656 | JmpTriplet5 |
| 6* | 49 | 562,949,953,421,312 | JmpTriplet6Chk |
| 6 | 50 | 1,125,899,906,842,624 | JmpTriplet6 |
| 6 | 51 | 2,251,799,813,685,248 | JmpTriplet6 |
| 6 | 52 | 4,503,599,627,370,496 | JmpTriplet6 |
| 6 | 53 | 9,007,199,254,740,992 | JmpTriplet6 |
| 6 | 54 | 18,014,398,509,481,984 | JmpTriplet6 |
| 6 | 55 | 36,028,797,018,963,968 | JmpTriplet6 |
| 6 | 56 | 72,057,594,037,927,936 | JmpTriplet6 |
| 6 | 57 | 144,115,188,075,855,872 | JmpTriplet6 |
| 6 | 58 | 288,230,376,151,711,744 | JmpTriplet6 |
| 7* | 59 | 576,460,752,303,423,488 | JmpTriplet7Chk |
| 7 | 60 | 1,152,921,504,606,846,976 | JmpTriplet7 |
| 7 | 61 | 2,305,843,009,213,693,952 | JmpTriplet7 |
| 7 | 62 | 4,611,686,018,427,387,904 | JmpTriplet7 |
| 7 | 63 | 9,223,372,036,854,775,808 | JmpTriplet7 |

Fig. 6

FORMATTING FLOATING POINT NUMBERS

PRIOR APPLICATIONS

The present document incorporates by reference the entirety of each of the following U.S. patent applications: Ser. No. 61/701,630 filed Sep. 15, 2012, Ser. No. 61/716,325 filed Oct. 19, 2012, PCT/US14/22021 filed Mar. 7, 2013, Ser. No. 61/799,489 filed Mar. 15, 2013, PCT/US13/58410 filed Sep. 6, 2013 as amended per petition filed Sep. 29, 2013, Ser. No. 61/862,006 filed Aug. 3, 2013, Ser. No. 62/014,638 filed Jun. 19, 2014, Ser. No. 14/425,046 filed Mar. 1, 2015 including the incorporated text file "Listing_6058-2-3A.txt" with file creation date Sep. 6, 2013 and file size 89,565 bytes, and all applications incorporated by reference into any of the foregoing applications. To the extent permitted by applicable law, the present application also claims priority to any and all of the foregoing applications.

COPYRIGHT AUTHORIZATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

In particular, and without excluding other material, this patent document contains original assembly language listings, tables, C and C++ code listings, pseudocode, and other works, which are individually and collectively subject to copyright protection and are hereby marked as such under formal notice. All notices referring to the original copyright owner NumberGun LLC now pertain to, and inure to the benefit of, that entity's successor-in-interest, John W. Ogilvie.

BACKGROUND

Many software applications and computing systems at some time display numbers, on a display screen, in printed reports, on web pages, or elsewhere. Many programs use floating-point numbers which are converted from their native binary format into a human-readable decimal format. Such applications run on desktop computers, laptops, mainframes, and servers, for example.

Environments for writing software in many programming languages provide developers with functions to format binary representations of numeric values into one or more corresponding decimal representations, and with printf-style formatting functions. As used herein, "printf-style functions" include functions or other programming language statements which accept as input a format control string and zero or more other parameters, and produce an output string which is formatted according to the format control string and which includes values obtained from other parameters when other parameters are present. Sometimes formatting is implicit in the choice of printf-style function used, e.g., a WriteLine( ) or println( ) function would be expected to include a newline at the end of the output string even without an explicit newline in the format control string.

Many printf-style functions accept a variable number of parameters (i.e., different invocations of the function may pass a different number of parameters), while other printf-style functions expect a fixed number of parameters. Most printf-style functions of interest herein either accept a variable number of parameters, or accept a fixed number of parameters which however include at least one parameter in addition to a format control string. Parameters may be "passed" to a printf-style function via a call stack, one or more global variables, one or more registers, or another data transfer mechanism.

Some examples of printf-style functions include printf( ) itself, C-based language variations such as sprintf( ) and fprint( ), FORTRAN's FORMAT-statement-controlled PRINT statement, and a great many others. Printf-style functions are often, but not always, named using some variation of a term such as "display", "echo", "message", "out", "print", "put", or "write", for example. Some printf-style functions use '%' to refer 945 to parameter positions in a format control string, e.g., "printf("Max=% d Min=% d", max, min);" and some use curly braces, e.g., "String.Format ("Max={0} Min={1}", max, min);" as references 945. Others may use different syntax.

SUMMARY

Flexible high-speed generation and formatting of application-specified strings is available through table-based base conversion which may be integrated with custom formatting, and through printf-style functionality based on separate control string parsing and specialized format command sequence execution. Mechanisms include digit group tables for immediate output with or without separation characters, dynamic format templates, format localization and customization, funnels, digit extraction in left-to-right or right-to-left order, scaling and size estimation, leading bit identification, casting, indexing with exponent bits, division via multiplication by select constants and shifts, fractional value manipulations, batching transformations, stamping safety zones, rounding tools, JUMP and CALL avoidance, tailoring to processor characteristics and word size, conversions between various numeric types and representations, command stitching, stack parameter analysis, printf compilation, and others. Tools are also provided for web page rendering, embedded and realtime systems, various other application areas, string length determination, string copying, and other string operations.

The examples given are merely illustrative. This Summary is not intended to identify key features or essential features of the claimed subject matter, nor is it intended to be used to limit the scope of the claimed subject matter. Rather, this Summary is provided to introduce—in a simplified form—some technical concepts that are further described below in the Detailed Description. The innovation is defined with claims, and to the extent this Summary conflicts with the claims, the claims should prevail.

DESCRIPTION OF THE DRAWINGS

A more particular description will be given with reference to the attached drawings. These drawings only illustrate selected aspects and thus do not fully determine coverage or scope.

FIG. 4 is table of special numeric values, which are denoted here "MagicNumbers", suitable for use in some embodiments;

FIGS. 5 and 6 collectively illustrate a jump table suitable for use in some embodiments.

DETAILED DESCRIPTION

Some Definitions

Figure 1:
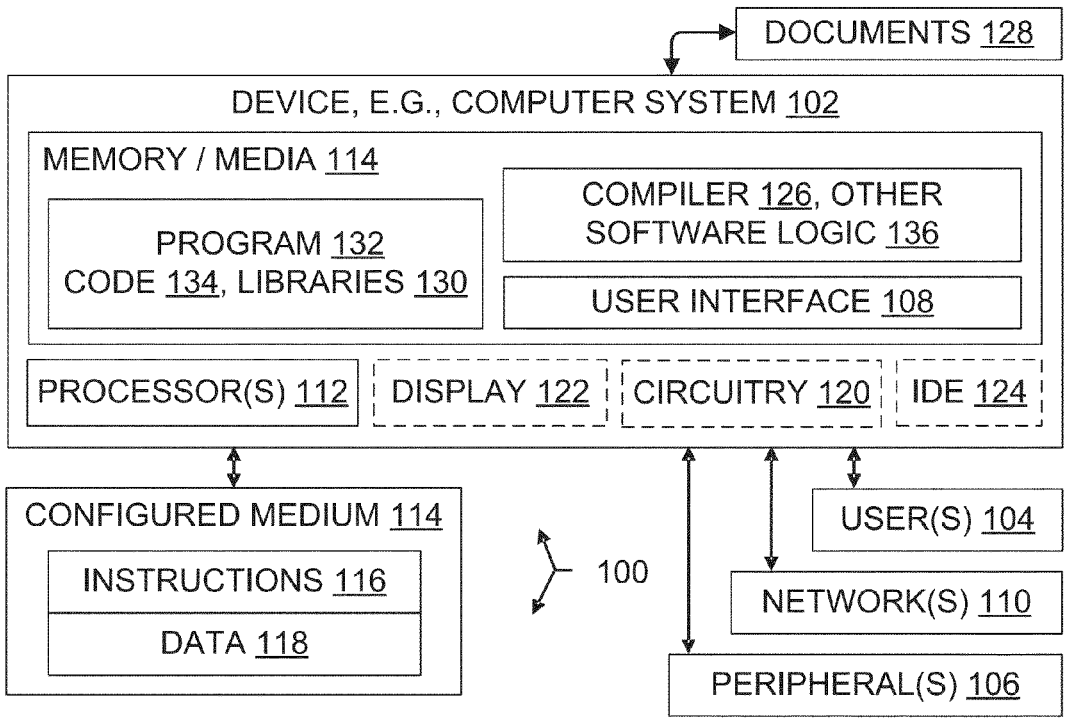
FIG. 1 is a block diagram illustrating a computer system having at least one processor and at least one memory which interact with one another under the control of software and/or circuitry, and other items in an operating environment which may be present on multiple network nodes, and also illustrating configured storage medium (as opposed to a mere signal) embodiments.
Figure 2:
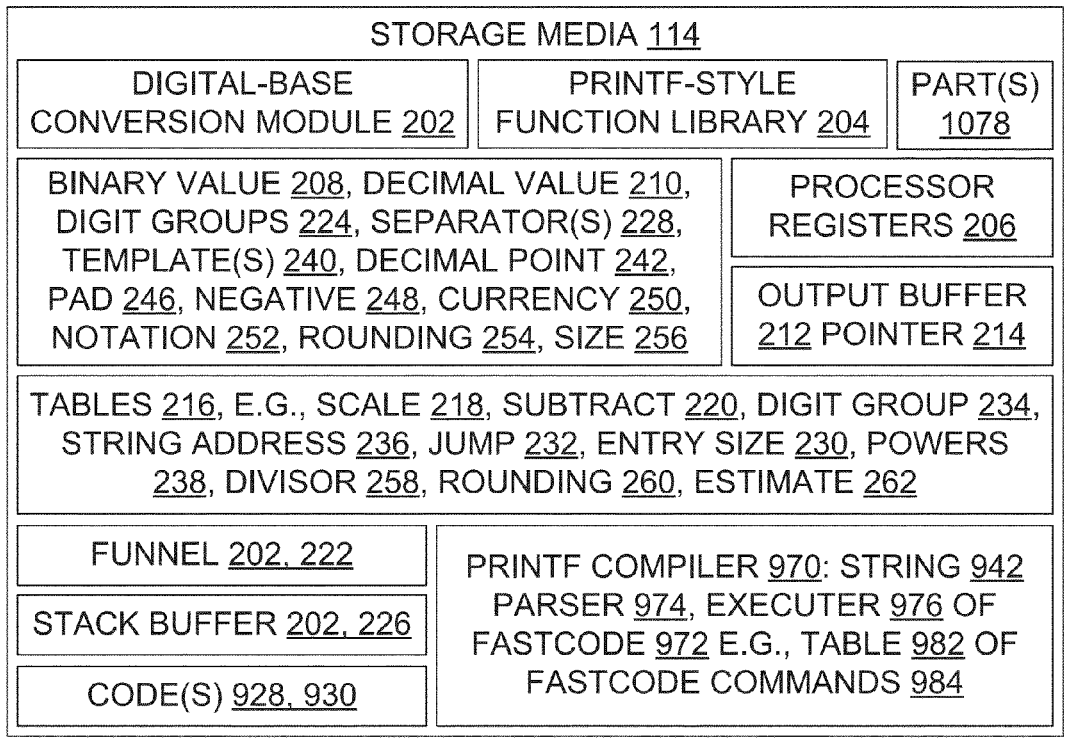
FIG. 2 is a block diagram illustrating aspects of architectures for base conversion, custom formatting, and/or printf-style functionality.
Figure 7:
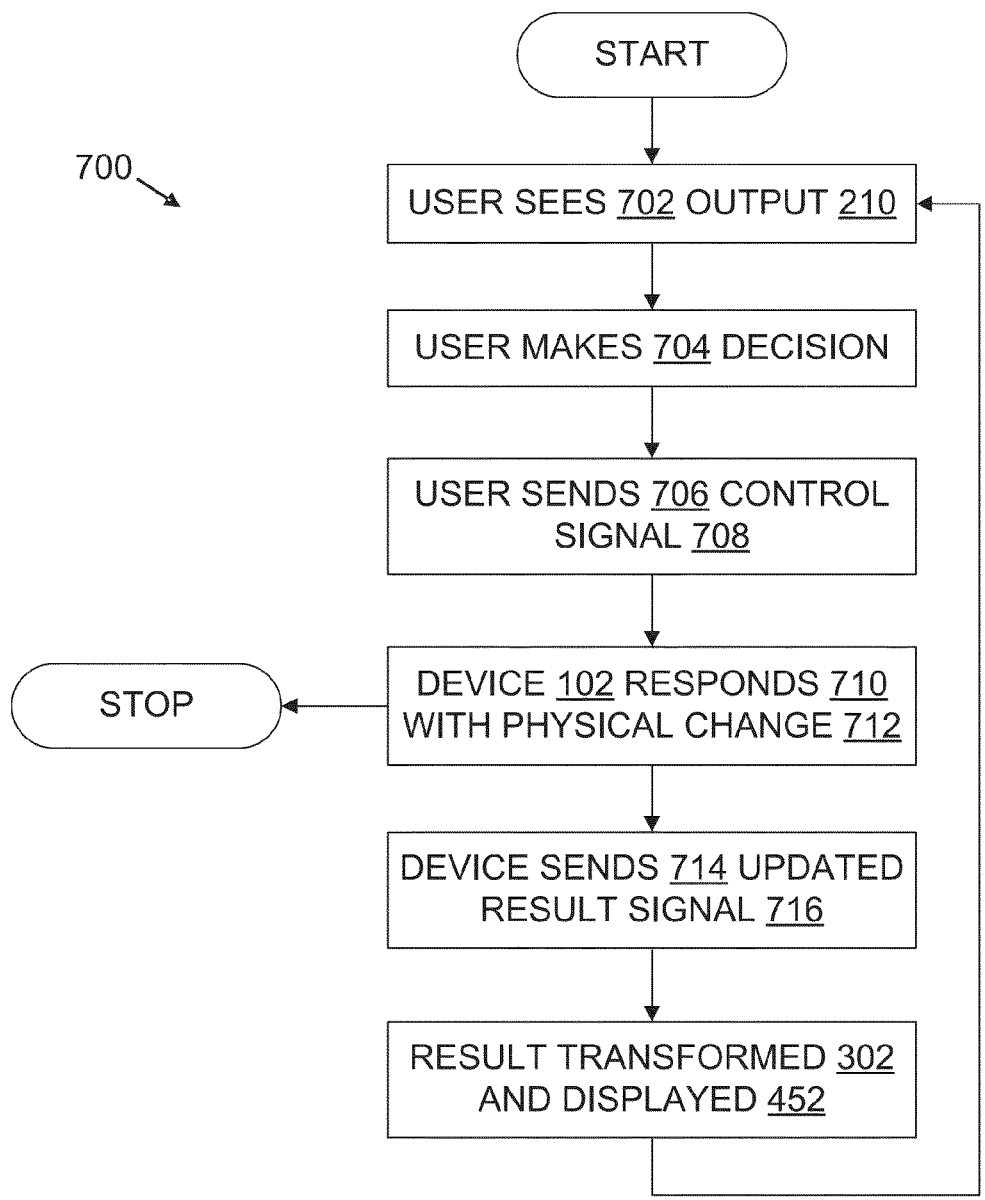
FIG. 7 is a flow chart illustrating realtime control loop steps of some embodiments.
Figure 3:
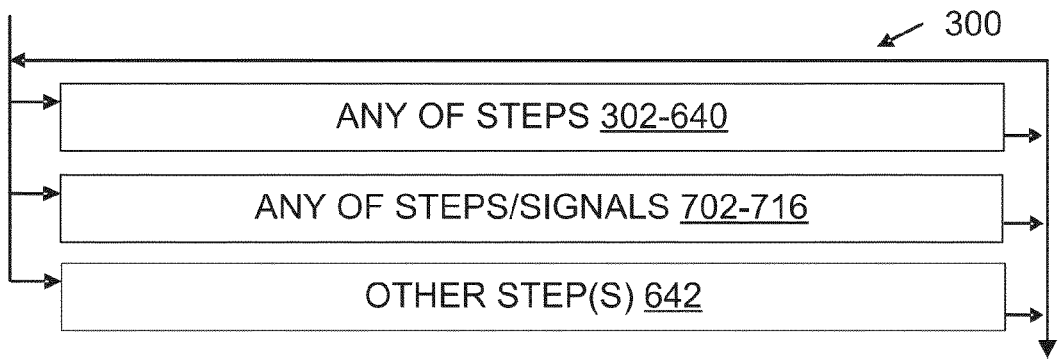
FIG. 3 is a flow chart illustrating steps of some process and configured storage medium embodiments.

Blank—Sometimes also referred to as 'space' or 'space character', this is the ' ' character with an ASCII value of 0x20 that is used for padding to achieve a specified Width.

FPU—Floating-Point Processor. Xmm, ymm, etc., registers use the same internal format and can also be used for certain floating-point operations.

GP Registers—General-purpose registers. On an Intel CPU, the 32-bit GP registers are: eax, ebx, ecx, edx, esi, edi, ebp, and esp. Several of the registers have 16-bit and 8-bit components (e.g., ax, ah and al can be used to access portions of the eax register). Each has a 64-bit equivalent (rax, rbx, etc.)

GT—Greater than.

GTE—Greater than or equal to.

Index—The value obtained from the Index2Doubles10 table (or other similar table) which is then used to access the Doubles10, FirstDecimal, and other tables as further described herein. The Index value −1 is used to indicate that the number is infinity or a NAN (the table is not accessed with an Index value of −1).

K—The value 1024; usually the lower-case 'k' immediately preceded by an integer. For example, '32 k' is equal to the value 32×1024=32,768.

LT—Less than.

LTE—Less than or equal to.

NAN—Not a Number. Used to represent +/−infinity, overflow, underflow, uninitialized number, or other uses.

Precision—number of decimal digits to display.

ULP—Unit in the Last Place, or Unit of Least Precision. ULP(x) is the distance between the two closest straddling floating-point numbers a and b (i.e., those where a<=x<=b, and a is not equal to b). See Wikipedia article "Unit in the last place."

Width—The user-specified length desired for the formatted output. If the output for a number with its signs and/or commas is less than this, extra blanks or zeros will be added to the output in accordance with the rules for doing so as explained in the present disclosure. If the output is larger, it will not be truncated, and no extra blanks will be written to the output buffer.

Zero—The term 'zero' is used many times in the present disclosure, and the exact meaning of the term will be clear to one of skill, given the context. The term can be used to refer to the floating-point value 0.0, or the integer value 0x00. When discussing zeros to be written to the output buffer, this generally refers to the character '0' which has an ASCII value of 0x30. Sometimes a null character (ASCII value 0x00) is referred to as zero.

Development and Execution Environment

Some examples assume use of the FASM Flat Assembler, freely available on the Internet at flatassembler dot net. This formatting means, system, process, and/or configured computer-readable storage medium can be implemented in any suitable language and on any CPU; it is not restricted to Intel CPUs only, nor to the FASM or MASM assembly languages. Note also that most CPU instructions can operate on more than one register; the choice of register usage is therefore largely up to the skilled implementer, and can vary from what is shown in the accompanying examples and sample code.

Additionally, although some examples herein assume a 32-bit execution environment on a Little-Endian CPU, the claims are not restricted to this environment. One of skill can adapt them to 64-bit (and larger) environments and/or Big-Endian CPUs, while still falling under the scope of this formatting means, system, process, and/or configured computer-readable storage medium.

Description of Tables Used

Some examples utilize the following tables. The tables include (i.e., comprise) static values that do not change once the tables are loaded and/or created and initialized. In an initial embodiment, the Index2Doubles10 table is initialized when the code is first accessed, while other tables are static and created during the compilation step before the code is accessed.

Doubles10. A list of 64-bit floating point numbers used to determine the magnitude of the number being formatted. The first entry is 0.0. The following entries are ascending powers of ten starting with 1.0e−308 and going through 1.0e+308; each entry is 10 times greater than the previous. At the end of the table is placed the 64-bit integer value −1 (all bits are set to 1), which is not accessed directly as part of this table, but is useful as establishing an upper boundary to the table when the Index2Doubles10 table is created. In other words, the table contains the following values: 0.0, 1.0e−308, 1.0e−307, . . . , 1.0e+307, 1.0e+308, 0xffffffffffffffff.

In some embodiments, the first non-zero power of ten entry is 1.0e−307, which is the first normalized power of ten closest to zero; other larger values can also be used. In this case, the skilled implementer will make appropriate changes to the program code as needed to accommodate this value as the first normalized entry in the table.

Some entries in the table are given specific labels in order to make them easier to access. The label 'Doubles10.Small' is assigned to the entry whose value is 1.0e−02; 'Doubles10.Border' to 1.0e−01 (one tenth); 'Doubles10.One' to 1.0e+00 (one); and the label 'Doubles10.Ten' to 1.0e+01 (ten).

The floating-point format cannot represent all numbers exactly; there can be some unavoidable imprecision. For example, since the value 1.0e−305 cannot be represented exactly by the floating-point format, it could be represented (a) as 9.9999999999999999620e−306, or (b) as 1.0000000000000001227e−305. Internally, (a) and (b) are 1 ULP apart. Note that the distance between the value 1.0e−306 and (a) is 3.8e−323, whereas the distance between 1.0e−305 and (b) is larger, 1.227e−321. Since (a) is closest, it would generally be used to represent the value 1.0e−305.

Alternatively, one could choose for each entry the value closest to, but not less than, the target value, in which case (b) would be desired. Using different values can produce a slight difference in formatting, especially with the lower-significance digits (digits further away from, i.e. to the right of, the most-significant digit). For example, a value such as 9.9999 may format as 9.9999 or as 10.0000 depending on the specified precision and the table values selected.

One of skill may want to determine for each value in Doubles10 whether a value 1 ULP different from the value created by the compiler is desired; then, once the values have been verified and/or adjusted, the entire table of entries can be converted into a list of hexadecimal numbers, one for each entry, used to represent each value exactly in the source code and then used to create a static version of the table with the precise values chosen for each entry.

Index2Doubles10. Each value is a 16-bit integer. The table is accessed via the high 16 bits of the floating-point number. If accessed after the sign bit is cleared as in the initial embodiment, only 32 k entries are required; otherwise, 64 k entries are required, with the second group of 32 k entries exactly the same as the first. The value −1 is used to represent a NAN or Infinity. A value of 0 represents either the number 0.0 or a Denormal value. Any other value is an index into Doubles10 to an entry in the table assumed to be the closest power of ten that is less than or equal to the number. In some cases after the table is accessed, it is possible that the desired value is the previous entry; therefore, as described below, the values are checked to ensure that the proper index is returned after accessing this table. The table is 64 k bytes in size (or 128 k if used with both signed and unsigned numbers).

One method to create such a table is illustrated by the following:

```
; InitIndex2Doubles
; On entry: nothing
; On exit: Index2Doubles10 will be updated based on the
;          Doubles10 table
```

The table will be accessed by extracting the high 16 bits of the floating-point number and using that as an index into the Doubles10 table. To init the Index table, need to cycle through all valid ranges to find the greatest value in the Doubles10 table that is less than or equal to that number. If the current edx:eax is exactly equal to the value in the Doubles10 table, use that slot. Otherwise, advance to the next slot until one is found that is LTE edx:eax. We can use integers to do this, since the floating-point design allows numbers to be compared via GP registers, which can be faster than using the FPU. So on each iteration, we adjust edx:eax to equal the next value (all lower bits are set, upper 16 are incremented each iteration) and find the greatest entry in Doubles10 that is <=that value. When the proper value is found, the index of that value is recorded in the Index2Doubles10 table. For denormalized numbers, the hi dword cannot be used to determine the value, due to imprecision. Therefore, if the index 0 is returned from the table, need to process further to determine whether it is 0 or a Denormal.

```
__INC_EDX equ add edx, 0x10000
__FP_NAN_FLAG = −1
proc InitIndex2Doubles uses eax ebx edx esi edi
        mov     esi, Doubles10
        mov     edi, Index2Doubles10
        ; edx:eax will be the temp number to find in the table
        ; init regs
        mov     edx, 0xffff         ; set all 16 lo bits
        mov     dword [dummy_FP], −1; set lo dword
        mov     ebx, esi            ; make a copy of the table...
.Main:
        call    .FindMatch
        ; Init for the next one
        __INC_EDX
        ; And see if we have reached the NaN section
        cmp     edx, 0x7ff00000
        jb      .Main
        ; Time to update all NaN values with __FP_NAN_FLAG...
        ; All values have to be interpreted to determine the
        type of NaN
@@:
        mov     word [edi], __FP_NAN_FLAG
        add     edi, 2
        __INC_EDX
        jns     @b
        ; Finished updating the table!!
        clc
        ret
.FindMatch:
```

A goal at FindMatch is to find the greatest entry in Doubles10 that is LTE to edx:eax. Make sure next entry is not LTE, else we need to select that and loop back to the start. Note that all entries in Doubles10 are listed in ascending order.

```
; On entry:
; edx:eax        number to find (eax will be set to −1 each
iteration)
; esi            -> current position in Doubles10 table
; edi            -> next position to update in Doubles10 table
;
; On return:
; edi            advanced to next position
; esi            adjusted if necessary
        mov     eax, −1          ; must always be −1
        ; Load the 'dummyFP' value we are creating...
        ; This is an 8-byte aligned variable in the .data space
        mov     dword [dummy_FP+4], edx
.Start:
        ; Load the current value from Doubles10, clear it when
finished
        cmp     edx, [esi+4]     ; compare hi dwords
        ja      .CheckIt
        jb      .DataErr         ; this should not happen!!
        ; hi dwords are equal, so try lo dwords...
        cmp     eax, [esi]
        ja      .CheckIt
        jb      .DataErr
        ; lo dwords are equal, so this works
.GotIt:
        mov     eax, esi
        sub     eax, ebx
        shr     eax, 3           ; divide by 8
        mov     [edi], ax
        add     edi, 2           ; point to next position
        retn
.CheckIt:
        ; compare next value...
        cmp     edx, [esi+4+8]
        jb      .GotIt
        ja      .TryNext
        ; They are equal, so check eax...
        cmp     eax, [esi+4+4]
        jbe     .GotIt
        ; Need to try the next one
.TryNext:
        add     esi, 8           ; point to next value
        jmp     .Start
. DataErr:
; Should never go here!
        pop     eax              ; clear ret address off stack
        stc                      ; indicate error
        ret                      ; and exit InitIndex2Doubles1000
endp
```

FirstDecimal. A lookup table of 16-bit entries used to determine the position of the first significant digit. Positive values are used to represent digits to the left of the decimal point, while negative values represent digits to the right. For negative values, each entry in this table is equivalent to the exponent of its matching entry of the Doubles10 table; for positive values, each entry is one greater than the exponent of its matching entry of the Doubles10 table, and is equal to the number of digits that appear to the left of the decimal point. This table is accessed via the same Index obtained from the Index2Doubles10 table. The table is less than 2 k bytes in size.

As an example, the value from this table that would be obtained for the number 5.306e−07 is −7, which means that the first significant digit of this number occurs at the $7^{th}$ position to the right of the decimal point. The value obtained for the number 2.34e+84 is 85, meaning the first significant digit of this number occurs at the $85^{th}$ position to the left of the decimal.

One of skill could adjust these entries without departing from the spirit of the formatting means, system, process, and/or configured computer-readable storage medium. For example, all values could be negative, or all positive, with corresponding changes in the code as appropriate each time the value from this table is used. In an initial embodiment, this table consists of 16-bit word entries. The first entry is the value 1 (this is never accessed), followed by 308 entries from −308 to −1, and then followed by 309 entries from 1 to 309.

CheckOverflow. A lookup table comprised of 64-bit integers used to determine if, after a number has been rounded, its first significant digit has changed magnitude. For example, if the value 9.999 (9.99e+00) was to be rounded to two decimal places, it would become the value 10.00 (1.0e+01). The exponent increases by one, meaning there will be one more significant digit left of the decimal when the number is formatted after rounding.

The first entry of this table is 1. The next nineteen entries are powers of 10, starting with the value 10; each next entry is ten times the previous. A terminating entry of 0 is added at the end of the table. The table requires 168 bytes. In the initial embodiment, the size of each entry of this table matches the size of the integer that is created by the process hereafter described when each floating-point number is converted into its decimal form. In an initial implementation, each entry is 64 bits wide.

SignTbl. This table enables the proper display and handling of numeric sign formats, as further described in the present disclosure. The table is 512 bytes long and consists of the sSIGN_TBL structure for each sign; there are two such structures used for each format, one for positive numbers and one for negatives. The head sign is placed immediately before the first displayed digit, the tail sign is placed immediately after the last displayed digit, and headLen and tailLen are equal to the size of each respective sign (the size is 1 if to be displayed, else 0 if not). If head is not used, headLen is 0 (in which case, any value can be specified for head since it will not display in the final written output); tail and tailLen are handled similarly. totalLen is the total of the sizes of head and tail, and is equal to headLen+tailLen.

Structure for SignTbl:

```
struct sSIGN_TBL
    head        db ?; displays just before number
    tail        db ?; displays just after number
    notUsed     dw ?
    headLen     dd ?; # bytes for head
    tailLen     dd ?; # bytes for tail
    totalLen    dd ?; headLen + tailLen
ends
```

The following FASM macro is used to create the table entries:

```
macro SignTblEntry head, tail, headLen, tailLen {
    db head
    db tail
    dw 0
    dd headLen
    dd tailLen
    dd headLen + tailLen
}
```

The SignTbl table in an initial embodiment allows sixteen different methods of formatting positive and negative numbers. In this table, formats 0 through 4, and 8 through 12, are used; the others are currently blank and produce no formatting for the numeric sign. The table can format positive and negative numbers as follows (assume the number 34.567 is to be formatted, and that the character ƀ represents a blank character):

| Format | Positive | Negative | |
|---|---|---|---|
| 0 | 34.567 | −34.567 | |
| 1 | +34.567 | −34.567 | |
| 2 | ƀ 34.567 | −34.567 | |
| 3 | 34.567 | (34.567) | |
| 4 | ƀ 34.567 ƀ | (34.567) | |
| 8 | 34.567 | 34.567− | |
| 9 | 34.567+ | 34.567− | |
| 10 | 34.567 ƀ | 34.567− | |
| 11 | 34.567 | (34.567) | ; same as 3 |
| 12 | ƀ 34.567 ƀ | (34.567) | ; same as 4 |

Note that blanks are used to keep numbers aligned within a column. For example, with format 4, when positive and negative numbers are placed into the same column, the decimals will line up, keeping the column aligned as desired.

The following commands create the SignTbl table:

```
;   Table used to format pos/neg numbers...
label SignTbl

;                       Head    Tail    HeadLen    TailLen
;   0: Default...
    SignTblEntry        0,      0,      0,         0 ; pos
    SignTblEntry        '−',    0,      1,         0 ; neg
;   1: '+' flag
    SignTblEntry        '+',    0,      1,         0 ; pos
    SignTblEntry        '−',    0,      1,         0 ; neg
;   2: ' ' flag (blank)
    SignTblEntry        ' ',    0,      1,         0 ; pos
    SignTblEntry        '−',    0,      1,         0 ; neg
;   3: '(' flag
    SignTblEntry        0,      0,      0,         0 ; pos
    SignTblEntry        '(',    ')',    1,         1 ; neg
;   4: ')' flag
    SignTblEntry        ' ',    ' ',    1,         1 ; pos
    SignTblEntry        '(',    ')',    1,         1 ; neg
;   Pad with 3 sets of entries so that next '_' entries below are
;       positioned properly
```

```
;   5: thru 7:
    times .entry * 3 db 0
;   Entries for the formats when '_' underscore is also used
;   Note that entries for '(' and ')' are the same in either case
;   8: Default...
    SignTblEntry        0,      0,      0,      0 ; pos
    SignTblEntry        0,      '-',    0,      1 ; neg
;   9: '+' flag
    SignTblEntry        0,      '+',    0,      1 ; pos
    SignTblEntry        0,      '-',    0,      1 ; neg
;   10: ' ' flag (blank)
    SignTblEntry        0,      ' ',    0,      1 ; pos
    SignTblEntry        0,      '-',    0,      1 ; neg
;   11: '(' flag
    SignTblEntry        0,      0,      0,      0 ; pos
    SignTblEntry        '(',    ')',    1,      1 ; neg
;   12: ')' flag
    SignTblEntry        ' ',    ' ',    1,      1 ; pos
    SignTblEntry        '(',    ')',    1,      1 ; neg
;   13 thru 15:
    times .entry * 3 db 0
.sizeof = $ - SignTbl
.entry = sizeof.sSIGN_TBL * 2          ; size of pos and neg
structures
```

FP_JmpTbl. A jump table of 32-bit addresses is used to branch to the appropriate routine based on the Index found for the number being formatted. The address of the desired target branch location is stored, one for each entry of this table, based on the category for the number being formatted. The value 0.0, and all Denormal values smaller than 1.0e−308, will be identified with an Index of 0. If desired, a skilled implementer can use a table comprised of 64-bit addresses when used in 64-bit execution environments.

The following code can be used to create the jump table. Note that there is just one entry for Denormal numbers. There are 307 entries for Small numbers, representing those whose magnitude ranges from −308 to −2. There is one entry for Border numbers, whose magnitude is −1. And there are 309 entries for Large numbers, whose magnitude ranges from 0 to 308.

```
label FP_JmpTbl dword
; First entry of 0 denotes Denormal
        dd      FPtoA_f.Denormal
; Account for all Small entries
    ..n = 307
    while ..n
        dd      FPtoA_f.Small
        ..n = ..n − 1
    end while
; There is one .Border entry (= 0.1), where the number could
round up to have a digit left of the decimal
        dd      FPtoA_f.Border
; .Large entries could possibly have digits on either side
of the decimal
    ..n = 309
    while ..n
        dd      FPtoA_f.Large
        ..n = ..n − 1
    end while
```

Comma-Formatting Tables

Additional tables and constant variables are used to help format numbers with commas, as now described:

FP_CommaLen. This table is used to quickly determine the length of a comma-formatted number. Once the number of digits left of the decimal of the number has been determined (leftDigits), that number is used as an index into this table to determine the length of the formatted number (i.e., the total length of all characters left of the decimal) after commas are inserted (lenFormatted=FP_CommaLen[leftDigits]). The table and the appropriate code can be adjusted by a skilled implementer to accommodate other formatting requirements for specific locales where the formatted digits may be grouped in fixed or variable sizes other than three digits. For this table, the first entry is 1, followed by the values 1, 2, and 3, followed by the values 5, 6, and 7, then 9, 10, and 11, and so on. Code similar to the following can be used to create this table:

```
; Table of 16-bit lengths
; Used to indicate formatted size of digits+commas to the
left of the decimal
align 4
label FP_CommaLen word
    dw      1              ; this value (for 0 digits) is not used
    ..c = 1
    repeat 103
        dw ..c, ..c+1, ..c+2
        ..c = ..c+4
    end repeat
```

FP_CommaStart. It is necessary to determine how many digits appear in the first triplet (the digits to be written before the first comma); it is also necessary to adjust the formatting mask used when using xmm registers. The variable FP_CommaZeros can be used for both purposes as further described below (when used to determine the number of digits in the first triplet, the value obtained should be shifted right four bits).

```
; Table to obtain offset into FP_CommaMask and FP_CommaZeros
; Used to branch to proper comma-formatting function
; Max value used to access the table will be 309, but table
; will handle up to 312 entries
align 4
label FP_CommaStart byte    ; offsets into tables
    db      0              ; init with 0 − first used entry at offset 1
    repeat 104
        db 0, 16, 32
                           ; equal to 0, 1, and 2 when shifted right 4 bits
    end repeat
```

FP_Commas. When using xmm registers at least one comma is inserted into the high dword of the xmm register; this allows formatting of three triplets in parallel via the PSHUFB command as further described in the present disclosure. The label FP_Commas is used to point to a 32-bit dword that contains at least one comma, the offset of which must be known in order to properly create the entries for FP_CommaMask. If desired, a skilled implementer can use the FP_Commas label to point to any four-byte location in memory, such as the start of the FP_CommaMask table, that contains at least one comma; then, the numeric offsets that make up the FP_CommaMask table are adjusted as needed so that commas are placed into proper position after the PSHUFB instruction completes.

```
label FP_Commas dword
    db      ',,,,'
```

FP_CommaMask. The PSHUFB xmm instruction is used to quickly rearrange 12 consecutive digits representing four triplets, into four comma-separated triplets, in a single in-place operation. One of the three entries of this table is selected after determining the proper offset from the FP_CommaStart table (there are groups of three entries representing triplets: the first entry is used when there is just one digit in the first triplet; the second is used when there are two; and the third is used when there are three). Each entry contains 16 single-byte offsets that determine how the bytes in an xmm register are shuffled via the PSHUFB instruction. It is assumed that the skilled implementer is familiar with the PSHUFB instruction available on Intel and compatible CPUs.

```
    align 16
    label FP_CommaMask dqword
    ; Mask for when MSD is first digit
        db      0,12,1,2,3,12,4,5,6,12,7,8,9,12,10,11
    ; Mask for when MSD is second digit
        db      0,1,12,2,3,4,12,5,6,7,12,8,9,10,12,11
    ; Mask for when MSD is third digit
        db      0,1,2,12,3,4,5,12,6,7,8,12,9,10,11,12
```

FP_CommaZeros. This variable contains comma-formatted zero '0' characters. When leftDigits is sufficiently large (greater than _FP_MAX_SAFE_DIGITS), extra comma-formatted zeros are added to the output buffer after the last significant digit that was formatted and written to the output buffer. This table is accessed at offset 2, minus an offset equal to (n=one less than the number of digits in the first triplet). This second offset is obtained by shifting, four bits to the right, the value obtained from the FP_CommaStart table.

```
    label FP_CommaZeros byte
        ; Base will start at offset 2, then offset
        ;       will be applied (obtained from FP_CommaStart)
        db      '000,000,000,000,000'
```

Overview of Floating-Point Numbers

The current FPU as used by Intel-compatible CPUs is commonly used to help format floating-point numbers. Internally, the FPU can use an 80-bit format to help minimize precision errors. Numbers stored or handled external to the FPU are typically maintained in a 64-bit format. In this format, bits 0-51 are used for the significand; bits 52-62 are used for a biased exponent; and bit 63 is used for the sign.

A 32-bit format is also commonly used, but since 32-bit floating-point values are seamlessly converted into 64-bit numbers when loaded into the FPU, the present disclosure will focus on the 64-bit format. If desired, one of skill could adapt the current formatting means, system, process, and/or configured computer-readable storage medium to directly handle the 32-bit floating-point format and still remain within the scope of the claims.

Additionally, one of skill could also convert the current formatting means, system, process, and/or configured computer-readable storage medium to handle larger-precision floating-point formats, such as 80-bit and 128-bit formats. Since both these formats use a 15-bit exponent, the present formatting means, system, process, and/or configured computer-readable storage medium would need very little modification to directly process these formats. Some of the needed changes to be made by the skilled implementer include the following. Each number would occupy more bytes when stored in memory, and therefore the offset used to access the first index (the high 16 bits) would differ. Additionally, a 128-bit integer conversion function would be needed in order to process an integer larger than the 64-bit size described in the present disclosure. Portions of the code that compare entries with various values would also need to be modified to accommodate the larger-sized numbers.

Some floating-point numbers are eventually converted into a human-readable format. For example, this is done as part of the process used to create reports, to create text to display on a screen or in a log file, or to create HTML (or other) text strings that are displayed by a client pursuant to a server request. The present disclosure relates to the decimal representation of such numbers, uses the digits 0 through 9, and can include a decimal point and zero or more decimal places. It can also include commas to separate thousands places to the left of the decimal point. In contrast, the exponential-notation format (also known as scientific notation format) always includes just one digit to the left of the decimal point. It can include a decimal point, and zero or more decimal digits, followed by the letter 'e' or 'E', and then followed by the base-ten exponent of the number. For example, the floating point number 2.340001 e+02 can be shown in its decimal format as 234.0001, while the number 8.76e−10 is the value 0.000000000876 in its decimal format.

Inside the FPU, the only difference internally between a negative and a positive number is the sign bit (cleared to 0 for positive numbers, set to 1 for negatives); all else is the same. And in the present formatting means, system, process, and/or configured computer-readable storage medium, the sign of the number being formatted is identified and then, if negative, the number is forced to positive.

Since the floating-point format is imprecise, IEEE standards have been created that allow different types of numbers to be handled and processed on the FPU, thereby allowing computation of imprecise numbers. As such, there are several categories of numbers that need to be processed, such as the following:

NAN (Not a Number): These values are used to represent +/−infinity; overflow; underflow; uninitialized numbers; and other uses where the value is not in the range of valid numbers.

Zero: Interestingly, the value 0 can have either a positive or a negative sign. Its sign is ignored during calculations, although it is displayed during formatting.

Denormalized: Numbers closer to zero than approximately +/−2.2e−308. Denormal numbers have the smallest-possible exponent and a leading significant digit of 0; and the smaller the number, the fewer bits of the significand are used. The smallest denormal number is approximately +/−4.9e324, which has the least-significant bit as its only set bit.

Normal: Includes positive numbers in the range approximately 2.2e−308 to 1.8e+308; +/−zero; and negative numbers in the range approximately −2.2e−308 to −1.8e+308.

The Formatting Method

When formatting floating-point numbers, it is useful to quickly determine the category of the number being formatted. Various technical documents categorize floating-point numbers as either NAN, Denormal, or Normal. For the purposes of formatting numbers into decimal/ASCII form, it has been found that separating the numbers into six different categories facilitates formatting. The categories used in the present formatting means, system, process, and/or configured computer-readable storage medium are: NAN, Zero, Denormal, Small, Border, and Large. (Note that Zero, Small, Border, and Large numbers make up the broader Normal category.)

Note that the number sign is cleared before categorizing. Therefore, all numbers, at the time they are categorized via the Index which is obtained from the Index2Doubles10 table, will appear as positive and so will fall within the non-negative numeric range.

The NAN category includes infinity, quiet NAN, and silent NAN numbers; the value of a NAN can be positive or negative. Zero includes both positive and negative zero, and includes many numbers whose absolute value is greater than zero but that, due to their most significant digit being too small to display given the requested precision, are treated as though they were zero (e.g., the value 0.003 when formatted to two decimal places is treated as zero).

Denormal numbers are those numbers using the smallest available exponent and fewer than 52 bits in the significand. The actual value 0.0 is initially identified with Denormal numbers, but is quickly sifted out and handled separately.

Small numbers include all Normal numbers less than 0.1 (1.0e−01) and greater than zero. All non-zero rounded numbers having '0' as the first significant digit left of the decimal are Small numbers. Border numbers that are determined to be Small after rounding become part of the Small group, and all the rest become Large. Large numbers include all Normal numbers GTE 1.0 (1.0e+00).

Border numbers include all Normal numbers that have the value 0 to the left of the decimal point, and a non-zero digit immediately to the right of the decimal. In other words, Border numbers are less than 1.0 (1.0e−00) and greater than or equal to 0.1 (1.0e−01). This is a temporary category to help determine whether the number, after rounding, can be processed by the Small category methods (where the number is always less than 1), or if after rounding the number has changed and now has '1' as its first significant digit immediately to the left of the decimal and should be processed by the Large category. For example, the value 0.9994 is a Border number, since it has a zero left of the decimal and a non-zero digit immediately after. If formatted with a precision of 4, it will be formatted as the Small number "0.9994"; but if formatted with a precision of 3, it will be formatted as the Large number "1.000".

The sifting and then processing of each of the NAN, Zero, Denormal, Small, Border, and Large categories are described in the following sections: Large Numbers (.IsLarge); Small Numbers (.IsSmall); Border Numbers (.IsBorder); Denormal Numbers (.IsDenormal); Zero Numbers (.IsZero); and Handling NANs (.IsNan).

Exponential Notation

The formatting methods herein described can also be used to format numbers in exponential-notation format. The minimum number of characters written to the output buffer as a result of formatting a number in exponential-notation format is equal to one digit left of the decimal point, plus one for the decimal point, plus the number of digits to the right of the decimal point as specified in the Precision value, plus characters to represent the exponent (which can be shown in a format such as "e+xxx", where the "+" becomes '−' for numbers <1.0, and the specific format after the 'e' or 'E' can be modified as desired), plus characters used for the sign head and tail. When Precision is equal to zero, it's possible no decimal point will be displayed depending on user options (as explained elsewhere in the present disclosure).

The floating-point manipulation process is similar to that used for decimal format; as with the decimal format, it is helpful to use the same categories Denormal, Small, Border, and Large, as is described elsewhere in the present disclosure. Once the number has been converted to a 64-bit integer and written to the output buffer, a single decimal point is inserted after the first digit and the remaining digits shifted right by one character. The exponent value is easily retrieved by accessing the FirstDecimal table as described in the present disclosure; when the value retrieved is positive, the actual exponent is one less, whereas when the value retrieved is negative, it is the actual exponent to display. Note that it is possible the exponent may need to be adjusted by one value higher or lower depending on whether the value overflowed or underflowed, as described elsewhere.

The exponent will be written after the character 'e' or 'E' via a separate call to an integer-to-ascii format routine, such as described in a prior patent application incorporated herein, and formatting will be performed using information from the present disclosure and as otherwise customized by the skilled implementer. Normally, a minus sign is used to represent a negative exponent, while either a '+' sign or no sign is used to represent a positive exponent.

Maximum Number of Significant Digits

The 64-bit floating-point format specifies 52 significand bits, plus another implied bit, for a total of 53 bits of precision. The value $2^{53}$ is equal to approximately 9.0e+15, which indicates about sixteen digits of precision in the standard base-ten decimal format. The constant _FP_MAX_SAFE_DIGITS is set to represent the maximum allowed significant digits that will be written to the output; all other digits, as needed, will be written as '0'. In practice, the higher this constant, the less the precision will be for the least-significant digits written to the output buffer. A value of 17 is used in an initial implementation, although 16 or 18 could also be used.

For some floating-point numbers the FPU can create 64-bit integers that have 19 decimal digits. If desired, one could adapt the methods herein described to allow 19 digits to display (although the lower digits are often imprecise). To do so, set _FP_MAX_SAFE_DIGITS=18. Then at the appropriate point, test to see if the number of digits is GTE this value. If so, branch and scale the number, using 18 digits, as described elsewhere in the present disclosure. Test the scaled number to see if it is LTE the maximum value that can be scaled by 10 and not overflow (this number is equal to 9.2233720368547750400e+17). If so, multiply the already-scaled number by ten, round it, and 19 digits will be available when the number is converted to an integer. Otherwise, 18 digits are the most that are available.

Writing Blanks and Zeros

At various points in the algorithm, extra blanks (spaces) and/or zero '0' characters may be written to the output. When properly designed, the algorithm can write 4, 8, or 16 (or more) blanks or zeros at a time. Often, more than one blank or zero will need to be written in sequence to the current point of the output buffer. This is necessary to add padding to the left or to the right, or to add zero '0' characters in one or more of the following positions: leading zeros before the first significant digit to the left of the decimal point; zeros after the significant digits of a very large number but before the decimal point; zeros before a very small number and after the decimal point; or zeros after the last decimal digit due to the specified Precision value.

Four characters (blanks or zero '0' characters) can be written simultaneously by writing the value 0x20202020 (for blanks) or 0x30303030 (for zeros) as a dword and then adjusting the output position by four bytes (or in 64-bit execution environments, eight characters can be written as a qword and then the output location adjusted by 8). Sixteen characters can be written by using an xmm register loaded with all blanks (or zeros). Note that when using xmm registers, it may be necessary to first save the current value of any registers used (and when the function has finished, to then restore them to their original values). It is then useful to load one (say, xmm0) with all zeros and another (say, xmm1) with all blanks at the start of the formatting function. In cases where the floating-point formatting function is combined with other formatting functions such as in a sprintf-family of functions, these registers can be prepared by the calling program so that this floating-point-formatting function can rely on them having already been pre-initialized.

Note that when this method is used, it is often the case that extra characters are written to the output, although some or all of them could be overwritten as more items are written to the output buffer. This does not cause any problems as long as the buffer is sufficiently large to contain these extra characters, as is discussed elsewhere in the present disclosure.

User Options

Formatting floating-point numbers can include many options. In addition to determining the number's magnitude and rounding it so that it can be displayed in a consistent form, it can also include specifying the number of decimal places, leading zeros, or whether the number is left or right justified.

It is helpful to specify a Width, a Precision, a pointer to an output buffer, and other options which can be passed to the main function, either as separate parameters, or as bits either set or clear in a Flags variable which is a passed parameter. JUST_LEFT and JUST_RIGHT options allow either left- or right-justification of the formatted number. SHOW_DECIMAL can determine whether to display a decimal point when Precision is 0. LEAD_ZEROS determines whether to prepend leading zeros to right-justified numbers (this flag is ignored for left-justified numbers).

A flag such as FORCE_ZERO_POS could specify that any time a value is printed as zero, its sign is always forced to positive; this can help eliminate the sometimes annoying presentation where some zero values appear with a minus sign. To do this, the .IsZero branch can force the SignTbl entry to point to the positive entry based on the specified SignedFmt.

The minimum number of characters written to the output buffer as a result of formatting a number (when Precision is greater than 0) is equal to the number of digits to the left of the decimal point, plus one character for the decimal point, plus the number of digits to the right of the decimal point, plus the value sSIGN_TBL.totalLen from the SignTbl (which will be 0, 1, or 2 depending on the sign format specified and the sign of the number). When Precision is equal to 0, there will be no digits to the right of the decimal point, and the decimal point will be displayed only if specifically requested by a user-defined flag SHOW_DECIMAL. Note that Precision is equal to the number of digits to the right of the decimal point. The number of digits to the left of the decimal point is equal to FirstDecimal[Index] for Large numbers, and is always one digit (the digit '0') for Small numbers.

If Width is specified, it has no impact unless it is greater than the minimum size of the elements just described, in which case additional blanks will be added either to the left or to the right of the number, depending on the justification setting. If the LEAD_ZEROS flag is specified, the number will instead be preceded by zeros until the size Width has been reached—unless the number is left justified, in which case the LEAD_ZEROS flag is ignored. The written output always includes enough characters to represent the number, formatted as requested; it will not be truncated if Width specified a smaller size, but will expand if Width is larger.

SignedFmt can be used to specify one of the desired formats (one of the sixteen possible formats available in the SignTbl table) used to denote the sign for the formatted number. In an initial embodiment, the lower eight bits of the Flags variable are reserved for specifying the signed format (the upper four bits are cleared); this allows quick access of this value via the MOVZX command, without requiring any masking operations to isolate the value. Other bits of Flags are used to denote JUST_LEFT, JUST_RIGHT, SHOW_DECIMAL, LEAD_ZEROS, and other flags that the skilled implementer may desire to accommodate.

If no Flags are set, the default is RIGHT_JUST, no decimal point will display when Precision is zero, and no leading zeros will be produced, and no padding will be added. A Width of 0 (or, a Width smaller than the space required to format the number) has no impact on the formatted display; when Width is greater than the total space required, extra blanks will be displayed (or when RIGHT_JUST and LEAD_ZEROS are both specified, leading zeros will be displayed between the number sign and the first significant digit).

The formatted output created by the formatting means, system, process, and/or configured computer-readable storage mediums of the present disclosure is byte-oriented; with a simple last step at the end of the formatting process, the output can be quickly converted to double-byte wide-character display. This can be done using xmm (or ymm or larger) registers and the PSHUFB instruction in a process similar to that described in the section "Using Xmm Registers to Insert Commas", or by any other method familiar to one skilled in the art of programming.

The size of the double-byte output will be exactly twice the single-byte size, and it is easily converted to double-byte format by using xmm registers and a byte mask that simply shifts the bytes so that there is one byte in between, and with a null character being inserted in the in-between bytes. This converts each single-byte character into its double-byte equivalent, which for the characters used is equivalent to the unsigned 8-bit ASCII value of each character being extended to 16 bits. If the same buffer is being used for the double-byte conversion, one of skill would normally convert the formatted string from right-to-left (i.e., starting with the portion of the formatted string located at higher memory address) in order to not overwrite and therefore corrupt the string while it is being converted.

A Core Algorithm (Note that the methods herein described can be adapted for use, by the skilled implementer, as part of either the "printf compiler" feature or the "stitching" feature described in prior incorporated patent applications; the methods in the present disclosure can be used to format floating-point binary numbers into either decimal or exponential-notation format, as desired by the user. The "printf compiler" feature has two parts: a printf-compiler function ngParse( ) that is called once to prepare a custom format string for fast output, and a companion function ngFormat( ) that can then execute the formatting commands of that format string to generate the desired output, and can be called as many times as needed while avoiding the overhead of parsing the format string each time. The "stitching" feature is used to create a custom formatting solution that runs from beginning to end with no unnecessary calls or jumps to save as much time as possible, wherein sections of code are pieced together to create a single executable code path that can be directly executed by the CPU, reminiscent in hindsight to what a modern compiler does when it "inlines" code (inserts the body of a function into the code, rather than calling the function).

The tables described in the present disclosure must be available and properly initialized before the formatting function is called. As there are different categories of floating-point numbers, it is useful to be able to quickly identify the category for each number early in the formatting process. At various points in the algorithm described herein, the FPU is used to scale (i.e., multiply by a power of 10), compare, and truncate (i.e., convert to integer) floating-point numbers.

The skilled implementer will ensure that the FPU stack is properly maintained, and that all registers are properly popped off the FPU stack when no longer needed. It may also be necessary to first preserve some or all of the FPU registers and state information, and to then restore these when completed.

Even with the substantial speed improvements that have been made to the FPU relative to the GP registers, some functions are still done in the GP registers either because they are faster, or because that's the only way to perform certain needed manipulations. The algorithms described in the present disclosure take these issues into account. The xmm (or ymm, or other wide) registers can be used for stamping longer sequences of blanks or spaces, if desired.

The present formatting means, system, process, and/or configured computer-readable storage medium takes advantage of the fact that the IEEE specification for floating-point numbers was designed to permit comparison of numbers via either the FPU or the GP registers. Note that xmm, ymm, or other registers can be used instead of the FPU; the skilled implementer would use the equivalent commands for those registers or processors in order to implement the present formatting means, system, process, and/or configured computer-readable storage medium. Additionally, other CPU types, such as ARM, can likewise be programmed to implement the present formatting means, system, process, and/or configured computer-readable storage medium, which is not restricted to the Intel and compatible family of processors.

In some examples, the present formatting means, system, process, and/or configured computer-readable storage medium can be described as a table-based method for formatting floating-point numbers that uses a single MULTIPLY instruction (it does not use any DIVIDE command; for some very small numbers, including all Denormals, two MULTIPLY instructions are used). Inventive portions herein described include a fast method for determining the magnitude of a number to be formatted; methods to quickly scale any category of number so that all its significant digits to be displayed are converted into an integer; a fast and simple method for managing and properly displaying the sign of the number; fast methods for outputting sequences of padding blanks or zeros that must be added to a formatted number, based on user-specified options such as Width, Precision, and Justification; and fast methods to create a comma-based decimal format.

The following tables are initialized (as described elsewhere in the present disclosure) before any formatting can start: Doubles10, Index2Doubles10, FirstDecimal, CheckOverflow, SignTbl, and FP_JmpTbl.

Valid numbers (any number that is not a NAN) can be divided into three basic categories (remember that these values are absolute values where the original number sign is remembered and the numeric value to convert is made positive): Zero for any value equal to, or considered effectively the same as, zero; Small for all numbers less than 1.0 (where the first significant digit is to the right of the decimal), and Large for all numbers greater than or equal to 1.0.

Denormal numbers are initially processed differently than other Small numbers; all exponent bits are zero, and so the magnitude of these numbers cannot be adequately assessed by using the upper 16 bits of the number to access the Index2Doubles10 table. They will by multiplied by a power of 10 that guarantees that the resulting number, along with all desired significant decimal digits, will become a normalized number whose magnitude can then be assessed. In an initial implementation, Denormals are first multiplied by 1.0e308, processed as further described herein, and then ultimately handled by either the .IsZero or the .IsSmall code branch.

Other numbers less than 0.1 are handled by the .IsSmall branch, while numbers GTE 1.0 are handled by the .IsLarge branch.

Numbers less than 1.0 but greater than or equal to 0.1 are initially passed to the .IsBorder code branch. The specified Precision affects how Border numbers will be rounded. It is possible that some numbers GTE 0.5, after rounding, will become equal to 1.0, after which they will be handled by the .IsLarge code branch. Otherwise, the number will be handled by the .IsSmall branch (or .IsZero for rounded numbers less than 0.5 when Precision is equal to 0).

To begin the format process, the sign of the number is determined and a pointer is set to point into the SignTbl (see Numeric Head and Tail Sign). If negative, the sign is cleared to zero.

Next, the upper 16 bits of the number are used to obtain an Index from the Index2Doubles10 table. If the Index is equal to −1, the number is a NAN and control branches to .IsNan (see Handling .IsNAN Branch). Otherwise, Index is used to validate that Doubles10[Index] is LTE to the number; if not, Index is decremented so that it points to the previous entry of the Doubles10 table.

Index is then used to determine the proper branch via the FP_JmpTbl table (FP_JmpTbl[Index]), which passes control to one of the following code points: .IsDenormal, .IsSmall, .IsBorder, or .IsLarge.

In general, custom formatting methods have been created for two cases: those in which the first significant digit occurs to the right of the decimal (the Small category), and those in which the first significant digit occurs to the left of the decimal. As explained above, Border and Denormal numbers require special handling, described in detail below, before the handling process is passed to the appropriate point in the .IsZero, .IsSmall, or .IsLarge section.

The value 0.0 is a special case and is handled by the .IsZero code branch. Although it could be handled by either the .IsSmall or the .IsLarge method, it can be faster to process any zero value separately. Note that this includes all Small numbers whose first significant digit, after rounding, occurs to the right of the Precision range.

The .IsBorder branch handles numbers which initially are Small, but which after rounding could become Large. Once the number is rounded, control will branch to the proper point in either the .IsSmall or the .IsLarge branch.

The next step of each code branch is to determine the magnitude of the number. The specified Precision value, in addition to the magnitude of the number, combine to identify the proper value of the Doubles10 table that will be used to scale the number. The number is then scaled via a single MULTIPLY instruction, such that all significant digits are immediately to the left of the decimal point. In some cases (see the "Small Numbers (.IsSmall)" section for more details), the number requires multiplication by a power of ten greater than 1.0e308; in those cases, two MULTIPLY instructions are used. A different value than 1.0e308 can be used, and the skilled implementer will make appropriate adjustments so that after the two MULTIPLY instructions, the proper result is achieved as taught elsewhere herein.

Note that when characters are written to the output buffer, they are written to the current position as indicated by the output-buffer position pointer, which pointer is then updated to reflect the number of characters just written, unless otherwise indicated.

Alternatively, in cases where multiple characters are to be written such as several zeros simultaneously, a skilled implementer could position that pointer to immediately after the end of where the last character is to be written, and then use a negative counter, in such a way that only the counter needs to be updated during each loop iteration. The following sample code shows one way to do this; assume that the number of zeros to be written is in the ecx register and that the buffer output pointer, edi, first points to where the next character is to be written:

```
; ecx is # zeros to write to the buffer
; edi is the current buffer pointer
    add    edi, ecx       ; make edi point to the end
    neg    ecx            ; and make ecx a negative counter
@@:
    mov    dword [edi+ecx], 0x30303030 ; write four zeros
    add    ecx, 4         ; update the counter only
    js     @b             ; loop as long as ecx is neg
```

The following sections describe the details for each number group, starting at the point where code execution resumes immediately after branching via the FP_JmpTbl table described above.

Large Numbers (.IsLarge)

For Large numbers, the number of number of digits left of the decimal point is equal to (leftDigits=FirstDecimal[Index]) and the number of significant digits is equal to (totDigits=leftDigits+Precision).

If totDigits is LTE the value _FP_MAX_SAFE_DIGITS, the number is scaled by the entry that is (n=Precision) entries after the value 1.0 of the Doubles10 table; otherwise the number will be scaled by the entry that is (n=FirstDecimal[Index]−_FP_MAX_SAFE_DIGITS) entries offset from the value 1.0 of the Doubles10 table (n could be negative or positive), and totDigits will be made to equal to _FP_MAX_SAFE_DIGITS. The number is then rounded by adding 0.5 to the scaled result.

The number is then truncated and converted into a 64-bit integer. At this point, the number is checked to see if it underflowed or overflowed (see "Checking Underflow and Overflow"); adjustments are made if necessary as described therein.

At this point, if desired, one of skill could optionally format this number in exponential notation rather than in decimal format. To do so, the exponent is equal to (n=leftDigits−1), the integer number is written via the u64toa or equivalent function (the sign head, justification, Width, Precision, and other factors are taken into account similar to the methods described in the present disclosure), and a decimal point is inserted immediately after the first digit (all digits after the first are shifted one character to the right in the output buffer). The skilled implementer will determine the final format (for example, if the number being formatted is equal to 23450, it could be formatted as either "2.345e+04" or "2.345E04", if desired, with the exponent written by a fast u16toa function such as described in an incorporated patent application, or by a different itoa or utoa function).

For left justification, LEAD_ZEROS is ignored and the head sign is written to the output. The number is then written by calling the unsigned-to-ASCII function, which returns the number of digits actually written to the output buffer (numDigits=u64toa).

If numDigits is equal to leftDigits, all digits to the left of the decimal point have been written. The decimal point and (n=Precision) zeros are written, followed by the tail sign and any Width padding, as appropriate (see the sections entitled "Numeric Head and Tail Sign"; "Precision"; and "Width").

If numDigits is less than leftDigits, additional zeros are first written before the decimal point, (n=leftDigits−numDigits), after which the decimal point and other components are handled as described in the previous paragraph.

If numDigits is greater than leftDigits, the first (n=leftDigits) will be to the left of the decimal sign. All other digits just written are shifted to the right one character, and a decimal point is inserted at its proper location in between. If needed, additional zeros are appended until there are Precision digits to the right of the decimal point, and the other components are handled as explained elsewhere in the present disclosure.

For right justification, outputting the 64-bit integer is handled the same as described above for left justification. However, any padding is first written to the output buffer, followed by the head sign, and then all other components as previously described; but if LEAD_ZEROS is specified, the head sign is written first, followed by leading zeros, sufficient in number to cause the final formatted output to be (n=Width) characters wide. After all digits are written to the output buffer, the sign tail is written. See the sections entitled "Numeric Head and Tail Sign"; "Precision"; and "Width".

Small Numbers (.IsSmall)

For Small numbers, no significant digits are written to the left of the decimal point (other than '0'). The exponent for the number is equal to (exp=FirstDecimal[Index]); numZeros is set to equal the negative of the number of zeros between the decimal point and the first significant digit, and is equal to (numZeros=exp+1). Set (totDigits=numZeros+Precision) to determine the number of significant digits to write.

If totDigits is LTE the value _FP_MAXSAFE_DIGITS, the number is scaled by the power-of-ten entry that is (scaleFactor=Precision) entries after the value 1.0 of the Doubles10 table; otherwise the number will be scaled by the entry that is (scaleFactor=_FP_MAXSAFE_DIGITS+numZeros) entries after the value 1.0 of the Doubles10 table, and totDigits will be set to equal _FP_ MAX_SAFE_DIGITS.

In most cases, a single MULTIPLY instruction is used to scale the number such that all significant digits are immediately to the left of the decimal point. In some cases the number requires multiplication by a scaleFactor greater than 1.0e308. But since the value 1.0e308 is the greatest power-of-ten value supported by the 64-bit floating-point structure, two MULTIPLY instructions are used, with two power-of-ten values selected such that, when multiplied by each other, they equal the desired scaled factor and thereby scale the number appropriately. To illustrate, assume scaleFactor is equal to 1.0e313 (i.e., the number is to be scaled by the value 1.0e313, which is greater than the highest valid power-of-ten value supported by the 64-bit floating-point format); this is the case, for example, when the number is 3.45e−306 and Precision equals 313). In this case, the number is first multiplied by 1.0e308 and then by 1.0e05, resulting in a properly scaled number (i.e., 1.0e308×1.0e05=1.0e313).

The number is then rounded by adding 0.5 to the scaled result, and then truncated and converted into a 64-bit integer. At this point, the number is checked to see if the most-significant digit has shifted due to either overflow or underflow (see the section "Checking Underflow and Overflow") and variables are adjusted as explained in that section. At this point, the justification for the number is determined.

If desired, one of skill could optionally format this number in exponential notation rather than in decimal format. To do so, the exponent is equal to (exp=FirstDecimal[Index], or numZeros−1), the integer number is written via the u64toa or equivalent function (the sign head, justification, Width, Precision, and other factors are taken into account similar to the methods described in the present disclosure), and a decimal point is inserted immediately after the first digit. The skilled implementer will determine the final format (for example, if the number being formatted is equal to 0.0645, it could be formatted as either "6.45e−02" or "6.45E−02", if desired, with the exponent written by a fast i16toa function such as described in a prior incorporated patent application, or by a similar itoa function).

For left justification, LEAD_ZEROS is ignored and the head sign is written to the output. The characters "0." are then written.

If numZeros is less than 0, then (n=−numZeros) '0' characters are written to the output buffer. The 64-bit integer number is then written to the output buffer by calling the unsigned-64-bit-to-ASCII function, which returns the number of digits actually written (numDigits=u64toa({parameters passed to the function in the given implementation})). A procedure implementation of u64toa( ) could also be used, as opposed to a value-returning function u64toa( ) implementation. Any needed trailing zeros are now written (n=Precision+numZeros−numDigits; note that numZeros is LTE 0). These zeros can be stamped with multiple characters written at the same time, as described elsewhere in the present disclosure. The tail sign and any Width padding required are now written as appropriate (see the sections entitled "Numeric Head and Tail Sign"; "Precision"; and "Width").

If numZeros is not negative, no '0' characters need be written to the output prior to the number, and then the number and other components are written to the output as described in the preceding paragraph.

For right justification, outputting the 64-bit integer is handled as described above for left justification. However, any padding is first written to the output buffer, followed by the head sign, and then all other components as previously described; but if LEAD_ZEROS is specified, the head sign will be written first, followed by leading zeros, sufficient in number to cause the final formatted output to be (n=Width) characters wide (if the minimum size of the output is GTE Width, no leading zeros are written). See the sections entitled "Numeric Head and Tail Sign"; "Precision"; and "Width".

Border Numbers (.IsBorder)

Border numbers must be scaled, rounded, and converted to an integer, and checked for underflow and overflow; this is done the same as for other Small numbers. Then if the rounded value is still less than 1.0, the code will branch to the appropriate point in the .IsSmall code section (which is just after checking for underflow/overflow and adjusting if necessary) to continue formatting; otherwise, it will branch to the appropriate point in the .IsLarge code section (which is just after checking for underflow/overflow and adjusting if necessary) to continue formatting.

Denormal Numbers (.IsDenormal)

Denormal numbers are very small and range from less than approximately 2.2e−308 to about 5.0e−324; and due to the branching caused by the FP_JmpTbl table, numbers equal to zero also cause branching to this point. Therefore, the number is first tested to see if it is equal to zero; if so, control branches to the .IsZero code section. Note that the number is equal to zero if all bits are zero.

Since with Denormal numbers all exponent bits are zero, the magnitude of these numbers cannot be adequately assessed solely by using the upper 16 bits of the number to access the Index2Doubles10 table. Therefore, they are first multiplied by a power of 10 that guarantees that the resulting number, along with all desired significant decimal digits, will become a normalized number whose magnitude can then be assessed.

For example, if seventeen digits of precision are desired for a Denormal number, the last digit could be near 1.0e−340, which is 32 orders of magnitude smaller than the smallest denormalized floating-point number in the 64-bit format. Therefore, the number is first scaled by a value that causes the decimal point to shift right more than 32 places in order to further inspect and process the number.

In an initial implementation, the value (scaleDenormal=1.0e+308) is used to scale the number, which causes the decimal point to shift right 308 places. The number is then stored into memory so that it can be inspected and manipulated via the GP registers, the same as other Small numbers. The number is then processed the same as any other Small number, except that numZeros and firstDigit are adjusted by the value 308 to account for the fact that the number was first adjusted by the value scaleDenormal. Then, the number can be handled as any other Small number, with control branching to the appropriate point in the .IsSmall code section (in an initial implementation, this is the point immediately before the number is rounded and then converted to a 64-bit integer).

If desired, a quick test can be made to determine if the Denormal number should be treated as 0. If Precision is LTE the value 307, the Denormal number will be treated as zero, and control could branch to the .IsZero code path; it is rare for a user to desire more than 307 decimal places to display, so this can screen out most Denormal numbers that are effectively treated as 0.0.

Zero Numbers (.IsZero)

The number zero is simpler and faster to handle than other numbers, as there are no significant digits other than a simple '0'.

For left justification, the head sign is written, followed by the digit '0'. If Precision is equal to zero, a decimal point is not written to the output buffer unless the SHOW_DECIMAL flag is used. If Precision is greater than zero, a decimal point is written to the output buffer, followed by (n=Precision) zeros. The tail sign is then written, followed by padding if the value for Width is greater than the minimum output size.

For right justification, the head sign is first written to the output buffer followed by leading zeros when LEAD_ZEROS is specified, if the value specified for Width demands it; otherwise, padding is written if LEAD_ZEROS is not specified and the value for Width demands, followed by the head sign. The digit '0' is then written to the output buffer. If Precision is equal to zero, a decimal point is not written to the output buffer unless the SHOW_DECIMAL flag is used. If Precision is greater than zero, a decimal point is written to the output buffer, followed by (n=Precision) zeros. The tail sign is then written. See the sections "Width"; "Precision"; "Numeric Head and Tail Sign"; and "Writing Blanks and Zeros".

Handling NANs (.IsNAN)

A NAN will not display as a normal number, and there are three main types: Infinity, Quiet NAN, and Silent NAN. If desired, one of skill can display a unique message depending on the type of NAN identified. In an initial implementation, the strings "1.#INF00", "1.#QNAN0", and "1.#SNAN0" will be displayed, similar to the display produced by Microsoft Visual Studio's handling of NANs. The number of characters to display after the decimal point is determined by the specified Precision, and the Width and other flags are honored as for normal numbers displayed. Since NANs can be positive or negative, head and tail sign characters will also be written, as appropriate, to the output buffer.

Any floating-point number with all exponent bits set and with all significand bits cleared is Infinity; the sign determines whether it is positive or negative Infinity. Any floating-point number with all exponent bits set, with the significand bits non-zero but bit 51 clear, is a Silent NAN. Any floating-point number with all exponent bits set, with the significand bits non-zero but bit 51 set, is a Quiet NAN.

Writing the Converted Integer

The methods described in the present disclosure are fast. To keep the entire formatting process as fast as possible, it is suggested to also use the fast u64toa function described in a prior incorporated patent application when writing out the scaled, truncated 64-bit number to the output buffer. Alternatively, one of skill could use the standard ui64toa function from the C/C++ libraries, or another similar function.

Checking Underflow and Overflow

Due to imprecision of floating-point numbers, it is possible that the formatting process causes the rounded number to either underflow or overflow the expected magnitude, which can either decrement or increment the expected number of digits by one. This must be detected so that the number is formatted properly; otherwise, it could appear with an exponent (explicit or implied) either one increment too small or too big.

To show a case of overflow, assume the number 999.9996 is to be displayed with three decimal digits (Precision=3). When following the processes described in the present disclosure, the total digits expected left of the decimal point is equal to (totDigits=6). After scaling but before rounding, the number becomes 999,999.6; after rounding, the number becomes 1,000,000.1 and is converted to the 64-bit integer 1,000,000 which now has 7 digits instead of the expected 6; the number has overflowed. This is detected by comparing the 64-bit integer with the value at CheckOverflow[totDigits]; if it is GTE this value (which in this example is 1,000,000), the number has overflowed, and totDigits is incremented by one. For Large numbers, this means leftDigits is also incremented by one, while for Small numbers, the magnitude of the number is incremented by one, meaning there will be one fewer zero written between the decimal point and the first digit when the 64-bit integer is written to the output buffer.

Underflow occurs when the number being formatted is very close to a power of ten and imprecision causes the actual rounded number to straddle the boundary of that number and to fall on the low side. For example, assume the number 1.0e−01 is to be displayed with Precision=4; this means the expected 64-bit integer after rounding will be 1,000 and totDigits will be equal to 4. But if underflow occurs, the 64-bit integer will instead be 999, indicating the number has underflowed; the magnitude is one less, meaning one extra zero will need to be written between the decimal point and the first significant digit when the integer is written to the output buffer. This is detected by comparing the 64-bit integer with the value at CheckOverflow[totDigits−1]; if it is below this number, underflow has occurred, and the magnitude (or exponent) is decremented and the expected number of digits is also decremented.

Numeric Head and Tail Sign

To start formatting a number, the sign of the number is first determined; this is so that all numbers, including zero and NANs, are displayed with the desired sign at the desired position. Each number has both a head sign immediately to the left of the number and a tail sign immediately to the right. But if the format selected requires that either be suppressed, it does not appear in the final formatted output. This structure allows for displaying negative number with the minus sign either to the left or to the right of the number, or for parentheses to be used to denote negative numbers. Additionally, positive numbers can be represented by showing no indicator left or right of the number, or to show a plus sign left or right, or to include a blank space in the position where the sign would otherwise appear for negative numbers, such that all the numbers, both positive and negative, are aligned by their decimal points when displayed in a column.

An index into SignTbl is created based on the desired format used to display the numeric sign (such as: leading '−' for negatives and nothing for positives; or appended '−' for negatives and appended '+' for positives; or parentheses around negative numbers; etc.). As described herein, each entry in the table is 16 bytes in length, and each format uses two entries: one for positive numbers, and one for negative numbers, for a total of 32 bytes per format supported. The sign of the number determines which of the two entries is pointed to by the SignTbl index; see the description of the SignTbl table in the section "Description of Tables Used."

To illustrate this, assume format 3 is used to represent the sign of each number. With this format, positive numbers have no head sign preceding the number and no tail sign appended to the number (such as "124.45"), while negative numbers have no head sign but have a '−' minus sign appended to the number (such as "124.45−").

In methods without this formatting means, system, process, and/or configured computer-readable storage medium, a series of compares and jumps may be used at different places in the formatting algorithm, to account for either displaying or not displaying the sign; the complexity of the method increases if both a head and a tail sign are allowed (in the typical known format, a head sign of '−' is used for negatives only, and neither negatives nor positives have a tail sign). Or, portions of the code can be duplicated, with one path followed for negative numbers, and another followed for positive numbers. With the currently disclosed method, the process does not change even with different sign formats. One example of how to setup the pointer to the proper place in the SignTbl table is shown in the section "Detailed Description of Method to Format Number."

For left-justified numbers, the head sign is the first item written to the output, using instructions similar to the following (assuming esi points to the proper position of SignTbl):

```
mov    dl, [esi+sSIGN_TBL.head]
mov    [edi], dl
add    edi, [esi+sSIGN_TBL.headLen]
```

This writes the 'head' value from the table to the output buffer, whether a head value is required or not; no jumps or compares are needed to determine whether a head sign is required. And when edi is adjusted, if a value is required at that position, it will advance by one character such that the next character written to the output will be placed immediately after. But if no head is required, the value .headLen will be 0, meaning that edi will not be adjusted, and the next character to be written will overwrite this value. Due to out-of-order execution within the CPU, the processing of these instructions can overlap others, and can be faster than a standard if-then-else method requiring a compare and possible JMP instruction.

Writing the tail is similar, and happens immediately after the last portion of the number is written:

```
mov     dl, [esi+sSIGN_TBL.tail]
mov     [edi], dl
add     edi, [esi+sSIGN_TBL.tailLen]
```

For right-justified numbers, the head is written either immediately (when LEAD_ZEROS is specified and Width requires it), or after any padding has been written when Width exceeds the size that the formatted number will require. The tail is written after the last part of the number, and is the last item written to the output buffer (prior to any terminating zero that may be added).

Width

The user can specify a Width to ensure that the length of the formatted number is a specific size, with blanks added as padding (or, if the LEAD_ZEROS flag is specified, leading zeros may be added between the head sign and the first significant digit) until the desired size is reached; this is useful, for instance, when it is desired to align formatted numbers within a column. Note that when such column alignment is needed, it is also useful to select a sign format that includes a space for positive numbers for the head and/or tail, to match the head or tail sign for negatives that will be written, so that the displayed size of equivalent negatives and positives will match and their decimal points will be aligned.

For left-justified numbers, the number of blanks to add is determined after all components of the number are first written to the output buffer. The number of blanks is equal to the current output-buffer pointer (edi) minus the original start position ([locOrigDest]); if this value is not positive, the desired Width has already been achieved, otherwise this is the number of blanks to add. See the section "Writing Blanks and Zeros" for more details.

For right-justified numbers, the number of characters to be written is equal to numChars=Width−(length of the head and tail signs+number of digits left of decimal point+number of digits right of decimal point+width of written decimal point). Note that if Precision is equal to 0 and the SHOW_DECIMAL flag is not specified, the width of the decimal point is zero and it does not display, otherwise it is equal to one character. If the value 'numChars' is negative, no zero or blank characters are written. If the JUST_LEFT flag is specified, then (n=numChars) zeros will be written after the head sign; otherwise, (n=numChars) blanks will be written before the head sign.

Precision

The value specified for Precision determines the number of decimal places to be written to the output buffer. If Precision equals 0, then if the SHOW_DECIMAL flag is specified, a decimal point will be output; otherwise no decimal point will be written; and in all cases with Precision equal to 0, no decimal digits will be output.

When Precision is greater than 0, exactly (n=Precision) total decimal digits will be written to the output. In some cases with Small numbers, extra zeros will need to be written to the buffer immediately after the decimal point. If there are not enough significant digits such that (n=Precision) total digits will have been written after the 64-bit integer has been written to the output buffer, then extra '0' characters will be written until a total of 'n' decimal digits have been written to the output buffer.

Rounding Floating-Point Numbers

When a floating-point number is manipulated in order to prepare it to be displayed in human-readable form, various issues come in to play. One significant issue occurs when rounding a floating point number (which is done by adding the value 0.5 to the number, after it is first scaled): the magnitude of the first significant digit could change. For example, if the number is close to a power of 10, the exponent of the formatted number could increase by one, such as when the value 0.0099 (9.9e−03) is rounded to become 0.010 (1.0e−02).

The inherent loss-of-precision issues of the floating-point format can cause numbers to display slightly differently than the precisely-calculated value due to loss of precision when multiplying by a power of 10 and then rounding. For example, when formatted so that it rounds to two decimal places, the value 9.995 rounds to "9.99"—and not to "10.00" as expected. Why? This is because when the number 9.995 is converted to the 64-bit double floating-point format, its value cannot be represented exactly, although it is very close to the desired value. As displayed by the Microsoft Visual Studio® debugger (mark of Microsoft Corporation), this number is represented as the value 9.9949999999999992. So when normal rounding occurs inside the FPU, the digit used for rounding (the third digit to the right of the decimal) is 4. Since this is less than 5, the number will be rounded down, not up as expected.

The rounding method used with the present formatting means, system, process, and/or configured computer-readable storage medium is to first scale the number to be rounded with one MULTIPLY instruction (or two MULTIPLY instructions for Denormal numbers and for some small numbers) such that the digit used to round is found immediately to the right of the decimal point, and to then add 0.5 to the number. So in the case when rounding with Precision equal to 2, when the number 9.9949999999999992 is multiplied by 100.0, the result is 999.49999999999989 (as shown by the debugger), and the rounding digit is immediately to the right of the decimal point. Rounding the number be adding the value 0.5 converts the number to 999.99999999999989, which is formatted to display as "9.99". But if that same number is rounded with Precision equal to one, the number will round up and be formatted to display as "10.0", in which case the magnitude of the rounded number is incremented by one.

Non-Zero Numbers Equivalent to Zero

Certain Small and Denormal numbers are small enough they will display as the value zero. It can be useful to identify these numbers before performing all normal processing within the FPU, as described herein, so they can be displayed more quickly.

Any number whose exponent and significand bits are all clear is equal to zero. All numbers whose first significant decimal digit is two places to the right of the last Precision digit will display as zero, even after rounding. For example, with Precision equal to 3, the number 0.00009, after rounding, becomes 0.00014; since the '1' digit after rounding appears after the specified Precision, the number will display as zero.

Numbers whose first significant digit is immediately to the right of the last Precision digit, and whose value is '4' or less, will also display as zero after rounding (this is the usual case; but if the '4' is followed by a string of '9' digits, it's possible the number would round up). But if the value is 5 or greater, the number will round up. For example, with Precision equal to 3, the number 0.0004 will round to 0.0009 and will display as zero, while the number 0.0005 will round to 0.0010 and will display as "0.001".

A simple method, as used in an initial embodiment, determines that any number whose first significant digit is two places to the right of the last Precision digit, is known to be zero. Otherwise, the number will be processed normally; and if it is rounded to become zero, this causes no problems with the methods described herein.

Adding Commas to Formatted Numbers

Formatted numbers are easier to read when commas are used. Note that different locales can use different characters for the decimal point and/or for separators left of the decimal point. Additionally, some locales may separate numbers into groups other than three digits at a time, as discussed in a patent application incorporated herein. A skilled implementer can modify the formatting means, system, process, and/or configured computer-readable storage medium described herein to accommodate any such requirements for any locale, while staying within the spirit of the claims.

For purposes of explaining the present formatting means, system, process, and/or configured computer-readable storage medium, the comma and decimal formatting now described are based upon the common formatting used in the U.S.; the term 'comma' is used to refer to the character ',' used to group digits to the left of the decimal point; and the term 'decimal' is used to represent the '.' character that separates a number into a whole part on the left and a fractional part on the right.

Note that commas are needed only for Large numbers with four or more significant digits to the left of the decimal (this may differ for the needs of other locales); otherwise, the number will be formatted as any other non-comma-formatted Large number since it requires no commas. When formatting with commas, the LEAD_ZEROS flag is ignored in an initial embodiment.

The process of formatting numbers with commas is the same whether the number is left- or right-justified, although when the process has finished, the return location back to the .IsLarge code section depends on the justification. For left justification, control returns to the point just before the tail sign is written, and padding is then added if required. For right justification, control returns to the point just before the tail sign is written, which is the last step in formatting the number.

The comma formatting takes place immediately after the 64-bit integer is written to the output buffer (the head sign has already been output, and the tail sign is written immediately after comma formatting is completed, which is after the last decimal digits, if any, have been written to the output buffer).

After the rounded 64-bit integer is written to the output buffer, numDigitsWritten is equal to the number of digits written by the u64toa function, and leftDigits is equal to the number of digits to the left of the decimal point. Three cases are identified and handled separately, based on how numDigitsWritten compares to leftDigits.

If numDigitsWritten is equal to leftDigits, no decimal digits were part of the integer just written to the output buffer. The number is then formatted with commas as described in the section "Using Xmm Registers to Insert Commas". The output-buffer pointer (edi) is then advanced FP_CommaLen[leftDigits] characters to the right. If Precision equals zero, a decimal point is written only if the SHOW_COMMA flag is specified; otherwise, a decimal point is written and (n=Precision) zeros are stamped to the output buffer. Control then returns to the appropriate point in the .IsLarge code path based on the justification.

If numDigitsWritten is greater than leftDigits, there are (numDecDigits=numDigitsWritten−leftDigits) decimal digits written as part of the 64-bit integer. These decimal digits must be preserved before comma formatting the left digits; they are located numDecDigits bytes to the left of the current position of the output-buffer pointer, and there are fewer than 16. They are loaded into an xmm register (xmm2). The number is then formatted with commas as described in the section "Using Xmm Registers to Insert Commas". The output-buffer pointer (edi) is then advanced FP_CommaLen[leftDigits] bytes to the right, a decimal point is then written, followed immediately by the contents of xmm2. If Precision is greater than numDecDigits, then (n=Precision−numDecDigits) '0' characters will be stamped to the output buffer immediately after the last valid digit from xmm2. The output-buffer pointer will then advance to the position immediately after the last decimal digit, and control then returns to the appropriate point in the .IsLarge code path based on the justification.

If numDigitsWritten is less than leftDigits, there are more additional digits to be written before the decimal point (they will be '0' characters formatted with commas to separate triplets) and there are no significant decimal digits (other than zeros, if needed). The number is then formatted with commas as described in the section "Using Xmm Registers to Insert Commas". The output-buffer pointer (edi) is then advanced (n=FP_CommaLen[leftDigits]) bytes to the right, and now points to where a decimal point is written after all digits left of the decimal have first been written or stamped. There are still (numRemaining=leftDigits−numDigitsWritten) digits to be written immediately to the right of the valid comma-formatted digits just written; these digits will be all zeros with proper comma formatting. The position for the first byte to output is located (n=FP_CommaLen[numRemaining]) bytes left of the current output-buffer pointer, and the first triplet of these comma-formatted zeros is either one, two, or three bytes of '0' characters. The offset (ofs=FP_CommaStart[numRemaining]>>4) helps determine the start of the 16-byte value from FP_CommaZeros used to stamp the remaining digits left of the decimal; the 16-byte value which is located at FP_CommaZeros[2−ofs], is then loaded into xmm2 and stamped a sufficient number of times until all (n=numRemaining) digits have been written. If Precision equals zero, a decimal point is written only if the SHOW_COMMA flag is specified; otherwise, a decimal point is written and (n=Precision) zeros are stamped to the output buffer. Control then returns to the appropriate point in the .IsLarge code path based on the justification.

In an alternative embodiment where one triplet is handled at a time rather than 4 (such as when 32-bit registers are used rather than the 128-bit xmm registers), a ptr (dest) is made to point to the current output-buffer position just before the 64-bit integer is written to the output buffer. That integer is then written (via the u64toa function) to an offset that is (n=FP_CommaLen[leftDigits]) characters to the right of 'dest'; this ensures that no significant digits will be overwritten when commas are inserted into the left digits and/or when comma-formatted zeros are stamped into the output buffer. A pointer (src) is set to point to the position in the output buffer where the first digit was just written.

The size of the first triplet is identified; then that many digits are loaded from src, src is incremented by that many bytes, and the digits are written to dest followed immediately by a comma, and dest is incremented to point just past the comma. Thereafter, three bytes are loaded from src (and src+=3) and written to dest followed by a comma (and dest+=4) until all the significant digits left of the decimal have been comma formatted; when the number is large, extra comma-formatted zeros are written. A decimal point and decimal digits, if needed, are written to the output at the proper position; if decimal digits were included in the 64-bit integer written to the output, those will first be copied to their proper destination, and then any extra decimal '0' digits are written, if needed. Control then returns to the appropriate point in the .IsLarge code path based on the justification.

Note that ymm registers, which are twice the size of the xmm registers, could also be used, with care taken to not corrupt any fractional digits (by first loading them into another register, or by writing them to a safe offset in the output buffer) that are placed to the right of the decimal.

Using Xmm Registers to Insert Commas

Each xmm register holds 16 bytes. Each three-byte triplet of a decimal number will be converted into four bytes when a comma is added; therefore, four three-byte triplets of a decimal number without commas (12 bytes) is converted into 16 bytes when comma formatted.

This method could handle up to 24 digits that need to be formatted, even though there are no more than _FP_MAX_SAFE_DIGITS (16 or 17 in many implementations), and often fewer. This is not a problem; the buffer is large enough to allow reading and writing at the locations impacted by this process, this process is very fast and allows the out-of-order-execution features of modern CPUs to execute more than one instruction in parallel, and it eliminates comparison/jump logic.

In this algorithm, the output-buffer pointer (edi, in this example), which currently points to the end of the last digit written by the u64toa function, is adjusted to point to the start of the number that was just written to output by the u64toa function (edi-=numDigitsWritten). xmm0 is loaded with the 16 bytes located at the start of the number just written, from the position indicated by edi.

Only the first 12 bytes in the xmm register, however, will be formatted; the others will be overwritten, and it doesn't matter to the algorithm how many of the bytes are actual digits. xmm1 is then loaded with the next 16 bytes starting 12 bytes later (at edi+12). Note that any xmm registers can be used; the skilled implementer would also ensure that any content originally contained in those registers is restored as appropriate. Also, a single ymm register could be used instead, in which case the skilled implementer would also adjust the required tables to handle 24 source bytes rather than 12 at a time.

```
movdqu    xmm0, dqword [edi] ; grab first 12 digits,
                             ; last 4 are ignored
movdqu    xmm1, dqword [edi+12] ; grab second group
                                ; of 12 digits BEFORE anything is
                                written
                                ; in order to preserve them...
```

When the xmm register is loaded with digits from the number being formatted, the first twelve bytes are in offsets 0 through 11. A dword containing at least one comma is then loaded into the high dword (bit offsets 12 through 15). It is assumed, for the examples shown below, that a comma will be located at offset 12 after the comma dword is loaded.

```
pinsrd      xmm0, [FP_Commas], 3
            ; load several commas to hi end of xmm0
pinsrd      xmm1, [FP_Commas], 3
            ; load several commas to hi end of xmm1
```

Each register will then be shuffled by applying the appropriate mask found in FP_CommaMask, the offset of which is placed into the esi register and is obtained from the FP_CommaStart table (it is based on the number of digits in the first triplet left of the first comma and is found at FP_CommaStart[leftDigits]).

```
pshufb      xmm0, [FP_CommaMask+esi]
pshufb      xmm1, [FP_CommaMask+esi]
```

Each mask in the FP_CommaMask table lists the desired destination of each of the 12 digits after shuffling, and a value of 12 shows that the comma found at offset 12 is to be placed at that position.

For example, assume the number 12345678975310 is to be comma formatted with three decimal digits; the desired output would be "12,345,678,975,310.000". (Note that the first triplet '12' has two digits, meaning the second entry of the FP_CommaMask table is the one to use.)

After this number (as a 64-bit integer) has been written to the output by the u64toa function, the edi output pointer is adjusted to point to the first digit just written, and the 24 bytes starting at that position are loaded into two xmm registers; xmm0 loads the first 12 digits (plus whatever four bytes happen to follow the twelfth digit), and xmm1 loads the second 12 digits (plus whatever bytes happen to follow). After xmm0 is loaded, it looks like this (data at offsets 14 and 15 are unspecified in this example):

| offset: | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| digits: | 1 | 2 | 3 | 4 | 5 | 6 | 7 | 8 | 9 | 7 | 5 | 3 | 1 | 0 | x | x |

When the FP_Commas data is loaded into the high dword of xmm0, the result is:

| offset: | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| digits: | 1 | 2 | 3 | 4 | 5 | 6 | 7 | 8 | 9 | 7 | 5 | 3 | , | , | , | , |

When the mask at offset 16 of FP_CommaMask is applied to xmm0 via the PSHUFB instruction, the end result is this:

| offset: | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| digits: | 1 | 2 | , | 3 | 4 | 5 | , | 6 | 7 | 8 | , | 9 | 7 | 5 | , | 3 |

After the contents of xmm1 are processed identically, both xmm0 and xmm1 can now be written to the output buffer, overwriting the number that was written via the u64toa function; note that there are now 16 valid bytes in each register which are written sequentially to the output buffer.

```
; Write formatted groups...
movdqu   dqword [edi], xmm0      ; write at edi position
movdqu   dqword [edi+16], xmm1   ; write 16 bytes later
```

The result of this process is the comma-formatted number "12,345,678,975,310" but with extra bytes and potential garbage written to the output buffer immediately to the right of this. But since the buffer is long enough to hold the extra written bytes, this is a safe operation; and once the decimal point and decimal digits (three zeros to the right of the decimal in this case) are written, the output is exactly as desired.

Detailed Description of Method to Format Number

The methods herein described are compatible with the standard "printf" and "sprintf" specification as found in the C/C++ languages for formatting 64-bit double floating-point binary numbers into a decimal/ASCII format (such as "123.76888"). The methods herein described are either compatible with equivalent formatting methods used in other languages, or can be modified and customized by one of skill to allow for other options.

Some results of the present formatting means, system, process, and/or configured computer-readable storage medium include quickly identifying the sign and type of number being formatted (NAN, Zero, Denormal, Small, Border, or Large) and then quickly branching to a point where the code path processes that type of number. The magnitude of the number is determined, and the number is then scaled such that all significant digits are to the left of the decimal point, then rounded, then converted into a 64-bit integer by truncating the number in the FPU. Any padding, leading zeros, or justification are determined and handled, and the exact position where the first digit of that number is written to the output buffer is determined. Note that xmm, ymm, or other registers, and the related instruction sets used to manipulate such registers, can be used in addition to, or instead of, the FPU to help convert the number into a decimal format.

Note that when the result integer is obtained, the position of the decimal point is not necessarily after the last digit represented by that integer. The placement of the digits and of the decimal point depend upon the magnitude of the number and the specified Precision. When Precision equals 0, all significant digits will be to the left of the decimal point; and for some very large numbers, there will be additional zeros appended to the output prior to the decimal point. For some numbers, one or more digits will be to the left of the decimal point, with the remainder to the right. For some numbers, all the significant digits will be to the right of the decimal point. In some cases, there can be leading zeros after the decimal point but before the first significant digit. There can also be trailing zeros appended to match the specified precision.

Note that in some cases there can be leading blanks or leading zeros in front of the number. Also, in some instances no decimal point will display, and in some instances no digits or decimal point will display (as is the case when Precision=0 and the SHOW_DECIMAL flag is not specified).

In the present formatting means, system, process, and/or configured computer-readable storage medium, a 32-bit execution environment is assumed; all registers are 32 bits wide unless otherwise stated, and all parameters passed to the function are also 32 bits wide (the 32-bit address of the 64-bit floating-point number is passed on the stack as a reference parameter, rather than as an eight-byte value parameter). One of skill can convert this formatting means, system, process, and/or configured computer-readable storage medium to operate in a 64-bit (or larger-bit or smaller-bit) execution environment by acknowledging the different register size; for larger-bit sizes, the resulting program should operate faster, for example, as certain instructions that operate on only 32 bits at a time can be replaced by instructions that operate 64 bits at a time.

When the formatting function is called, the following parameters are passed to it: a pointer to a floating-point number stored somewhere in memory; a non-negative Width; a non-negative Precision; a pointer to an output buffer (in an initial implementation, the edi register will point to the output and will not need to be passed to the function) and a Flags variable such as previously described above. A calling convention to convert a floating-point number into ASCII decimal format such as the following can be used:

```
FPtoA_f(double *pNumber, __u32 Width, __u32 Precision,
    __u32 Flags);
```

Alternatively, one of skill could modify this formatting means, system, process, and/or configured computer-readable storage medium to allow passing of numbers as values, or in the FPU or xmm registers, for example; in such a case, depending on the execution environment, the number may need to be immediately stored to a proper memory location so it can be inspected via the general-purpose registers. Additionally, a skilled implementer could decide to pass other parameters separately, if so desired.

The specified output buffer must be sufficiently large to contain all the output generated from this command, including space at the end of the buffer to handle overwriting that occurs due to the algorithms used. The largest number (approx. 1.8e+308) with the largest allowed Precision (512) requires more than 820 characters. Signed numbers (and various signed formats), large Width values, and comma-delimited formatting also increase the size required for the buffer; using xmm or wider registers can also increase the size required.

Several features of the formatting means, system, process, and/or configured computer-readable storage medium cause data to sometimes be written into the output buffer beyond the end of the final formatted data; the buffer should be large enough to allow for these characters. In normal use, up to 15 (in some cases, a few more) extra bytes beyond the end of the number are written during formatting; when using comma formatting, up to 28 extra bytes could be written. These and other issues should be considered when determining the size of the buffer to use. In an initial embodiment, the length of the output buffer is at least 100 bytes longer than the maximum length expected to be used.

When the program gains control, various local variables are made available on the stack. The code segments below illustrate many, but not all, of the commands that can be used to implement the formatting means, system, process, and/or configured computer-readable storage medium as described;

those skilled in the art will know how to build a finished product that includes teachings from the present disclosure.

```
proc FPtoA_f uses ebx esi, pNumber, Width, Precision, Flags
    ; Local vars...
    locals
        locOrigDest    dd ? ; original edi value
        locSignTbl     dd ? ; ptr to SignTbl
        locIndexdd ? ; Index based on Number's magnitude
        locPtrTemp     dd ?
                       ; ==> 8-aligned mem space for FPU access
        locTemp dd 5 dup (?)
                       ; storage (must access via locPtrTemp)
        ; need to allocate 4 bytes more than needed, then
        ; addr will be ANDed with −8 to align properly
    endl
```

The number is loaded into registers where the high bit, which is the sign bit, can be inspected in the edx register.

```
; Get Number into edx:eax, branch if Zero
    mov   esi, [pNumber]        ; get ptr to Number
    mov   eax, [esi]            ; load lo dword
    mov   edx, [esi+4]          ; load hi dword
    mov   [locOrigDest], edi    ; preserve orig dest ptr
```

If the hi bit of the number is set, offset 16 is used when accessing the proper entry in SignTbl; if clear, offset 0 is used. The SignedFmt value (the first byte of the Flags variable) is used to determine the proper position to point at inside SignTbl, and then the offset just described is added to that value. The result is a pointer to the proper sSIGN_TBL structure in SignTbl so that sign indicators are rendered as desired via accessing the table. This pointer is stored in a local variable locSignTbl.

```
; Determine ptr to SignTbl...
    movzx esi, byte [Flags] ; get SignedFmt
    shl   esi, 5       ; this is value to point to table...
    test  edx, 0x80000000; is Number signed?
    jz    .Positive    ; already positive
; Number is negative, so adjust table and force num to
positive
    add   esi, sizeof.sSIGN_TBL
    and   edx, 0x7fffffff ; clear sign bit (make num pos)
.Positive:
    mov   [locSignTbl], esi   ; and update ptr to proper
table
```

The positive number is then stored in the portion of a local variable that can be 8-byte aligned. Such a location can be identified by allocating local stack space of 12 or more bytes (this method assumes the stack is 4-byte aligned). Identify the address starting at offset 4 of that variable, then AND the address with the value −8 to create a pointer to an 8-byte-aligned portion of memory inside that local stack space; that pointer can be saved to locPtrTemp, and can then be used as needed to load or store numeric values via the FPU. Note that the FPU also works with non-eight-byte-aligned memory space, but such non-aligned memory could slow down access to the memory storage.

```
; Setup FPU storage
    lea   ebx, [locTemp+4]      ; access 4 bytes into locTemp,
                                ; then align
    and   ebx, −8
    mov   [locPtrTemp], ebx     ; this is aligned memory space
    ; ebx points to valid storage space
```

```
; Store Number locally
    mov   [ebx], eax            ; store locally
    mov   [ebx+4], edx
```

At this point, the sign of the number has been identified and the number has been made positive and then stored in an 8-byte-aligned portion of local memory. At this point, it is possible to branch to a .IsZero routine if the value is zero; if all bits of the number are clear, it is equal to 0.0. In an initial implementation, the test for zero is delayed until control branches to the .IsDenormal branch.

The upper 32 bits of the floating-point number, with the upper bit cleared, will be in the edx register; shift edx to the right 16 bits to isolate the upper sixteen bits, which are used as an index into the Index2Doubles10 table in order to obtain a new Index.

```
; Determine index into Doubles10 table (put into
ecx)...
    mov   ecx, edx
    shr   ecx, 16         ; moves hi 16 bits to lo portion of ecx
    movsx ecx, word [Index2Doubles10 + ecx*2]
```

In this case, ecx is now Index. If ecx is negative, there is no need to check any other entry since the number being formatted is a type of NAN; the exact type of NAN can be further tested and an appropriate display string generated.

```
    test  ecx, ecx         ; see if signed (is NAN or INF)
    js    .IsNAN           ; Number is NAN or Infinity
```

At this point, Index (currently in ecx) is used to confirm that the entry of the Doubles10 table, identified by using Index to access the Index2Doubles10 table, is less than or equal to the number being formatted (which is still in edx:eax); if not, the previous entry is selected.

```
    cmp    edx, dword [Doubles10+ecx*8+4]
    ja     .GotIndex
    jb     .UsePrevIndex
; Hi dwords are equal, so check lo dwords
    cmp    eax, dword [Doubles10+ecx*8]
    jae    .GotIndex
.UsePrevIndex:
    dec    ecx
.GotIndex:
    mov    [locIndex], ecx ; store in local var
```

Index can now be used to reliably determine which method to use to continue formatting the number. Program execution can now branch to the proper code path to start formatting the number. Either a series of compare statements and numerous jumps can be used, or, as in an initial embodiment, a jump table can be used to cause proper branching based on the Index identified above.

jmp [FP_JmpTbl+ecx*4]; branch based on FP_JmpTbl table

At this point, control will jump to the destination based on the value of Index. For more information, see "FP_JmpTbl" in the section "Description of Tables Used."

When the relevant code path has completed formatting the number, control branches to .Exit, where the size of the just-written output string is placed into eax and the function returns to the caller. If desired, a null terminator can be written to the end of the string, although this step can be skipped if this function is called by another function that will eventually terminate the buffer (such as can be the case when this function is called as part of the sprintf function).

```
.Exit:
    mov     byte [edi], 0 ; terminate string
    mov     eax, edi
    sub     eax, [locOrigDest] ; eax = length just written
    ret
endp
```

CONCLUSION

Although particular embodiments are expressly illustrated and described herein as processes, as configured media, or as systems, it will be appreciated that discussion of one type of embodiment also generally extends to other embodiment types. For instance, the descriptions of processes also help describe configured media, and help describe the technical effects and operation of systems and manufactures. It does not follow that limitations from one embodiment are necessarily read into another. In particular, processes are not necessarily limited to the data structures and arrangements presented while discussing systems or manufactures such as configured memories.

Specific features of an example may be omitted, renamed, grouped differently, repeated, instantiated in hardware and/or software differently, or be a mix of features appearing in two or more of the examples. Functionality discussed as being at one location herein may also be provided at a different location in some embodiments.

Reference herein to an embodiment having some feature X and reference elsewhere herein to an embodiment having some feature Y does not exclude from this disclosure embodiments which have both feature X and feature Y, unless such exclusion is expressly stated herein. The term "embodiment" is merely used herein as a more convenient form of "process, system, article of manufacture, configured computer readable medium, and/or other example of the teachings herein as applied in a manner consistent with applicable law." Accordingly, a given "embodiment" may include any combination of features disclosed herein, provided the embodiment is consistent with at least one claim.

Any apparent inconsistencies in the phrasing associated with a given item in the text should be understood as simply broadening the scope of what is referenced. Different instances of a given item may refer to different embodiments, even though the same item name is used.

As used herein, terms such as "a" and "the" are inclusive of one or more of the indicated item or step. In particular, in the claims a reference to an item generally means at least one such item is present and a reference to a step means at least one instance of the step is performed.

Headings are for convenience only; information on a given topic may be found outside the section whose heading indicates that topic.

All claims as filed are part of the specification.

While exemplary embodiments have been described above, it will be apparent to those of ordinary skill in the art that numerous modifications can be made without departing from the principles and concepts set forth in the claims, and that such modifications need not encompass an entire abstract concept. Although the subject matter is described in language specific to structural features and/or procedural acts, it is to be understood that the subject matter defined in the appended claims is not necessarily limited to the specific technical features or acts described above the claims. It is not necessary for every means or aspect or technical effect identified in a given definition or example to be present or to be utilized in every embodiment. Rather, the specific features and acts and effects described are disclosed as examples for consideration when implementing the claims.

Although some possibilities are illustrated here by specific examples, embodiments may depart from these examples. For instance, specific technical effects or technical features of an example may be omitted, renamed, grouped differently, repeated, instantiated in hardware and/or software differently, or be a mix of effects or features appearing in two or more of the examples. Functionality shown at one location may also be provided at a different location in some embodiments; one of skill recognizes that functionality modules can be defined in various ways without necessarily omitting desired technical effects from the collection of interacting modules viewed as a whole.

All changes which fall short of enveloping an entire abstract idea but come within the meaning and range of equivalency of the claims are to be embraced within their scope to the full extent permitted by law.

The invention claimed is:

1. A system comprising:
    a processor;
    a digital memory in operable communication with the processor; and
    a module comprising software code residing in the digital memory which upon execution with the processor performs operations for formatting floating-point numbers using at least one of the following: (a) a powers of ten table containing 64-bit floating point numbers used to determine the magnitude of a number which is being formatted, with a 0.0 entry and multiple entries which are ascending powers of ten, (b) a table of indexes into said powers of ten table used to locate an entry in the powers of ten table which is a power of ten closest on one side to the number which is being formatted.

2. The system of claim 1, wherein the module comprises software code which upon execution identifies NAN, Zero, and Denormal values.

3. The system of claim 1, wherein the module comprises software code which upon execution uses a lookup table to determine a position of a first significant digit of the number which is being formatted.

4. The system of claim 1, wherein the module comprises software code which upon execution uses a lookup table to determine if, after a number has been rounded, its first significant digit has changed magnitude.

5. The system of claim 1, wherein the module comprises software code which upon execution uses a sign table to determine display of numeric signs to at least the left or the right of the number which is being formatted.

6. The system of claim 1, wherein the module comprises software code which upon execution formats significant digits of the number being formatted with commas before all zeros to the left of a decimal point of the number being formatted are written.

7. The system of claim 1, wherein the module comprises software code which upon execution writes a sign and then adjusts an output pointer regardless of whether the sign remains in the formatted number, rather than performing compare-then-jump logic.

8. A process comprising:
a digital memory receiving a number in binary computational form, the number to be formatted for output as a legible string;
a processor executing software which performs at least one of the following:
  (a) determines the magnitude of the number which is being formatted by using a powers of ten table which contains 64-bit floating point numbers, a zero entry, and multiple entries which are ascending powers of ten; and
  (b) locates an entry in the powers of ten table which is a power of ten closest on one side to the number which is being formatted by using a table of indexes into the powers of ten table;
and
outputting the formatted number as a string.

9. The process of claim 8, wherein the software executed by the processor identifies NAN, Zero, and Denormal values.

10. The process of claim 8, wherein the software executed by the processor uses a lookup table to determine a position of a first significant digit of the number which is being formatted.

11. The process of claim 8, wherein the software executed by the processor uses a lookup table to determine if, after a number has been rounded, its first significant digit has changed magnitude.

12. The process of claim 8, wherein the software executed by the processor uses a sign table to determine display of numeric signs to at least the left or the right of the number which is being formatted.

13. The process of claim 8, wherein the software executed by the processor formats significant digits of the number being formatted with commas before all zeros to the left of a decimal point of the number being formatted are written.

14. A computer-readable storage medium configured with software which upon execution by a processor performs a method comprising:
receiving a number in binary computational form, the number to be formatted for output as a legible string;
determining the magnitude of the number which is being formatted by using a powers of ten table which contains 64-bit floating point numbers, a zero entry, and multiple entries which are ascending powers of ten;
for the same number whose magnitude the method is determining, locating an entry in the powers of ten table which is a power of ten closest on one side to the number which is being formatted by using a table of indexes into the powers of ten table; and
outputting the formatted number as a string.

15. The computer-readable storage of claim 14, wherein the software executed by the processor identifies NAN, Zero, and Denormal values.

16. The computer-readable storage of claim 14, wherein the software executed by the processor uses a lookup table to determine a position of a first significant digit of the number which is being formatted.

17. The computer-readable storage of claim 14, wherein the software executed by the processor uses a lookup table to determine if, after a number has been rounded, its first significant digit has changed magnitude.

18. The computer-readable storage of claim 14, wherein the software executed by the processor uses a sign table to determine display of numeric signs to at least the left or the right of the number which is being formatted.

19. The computer-readable storage of claim 14, wherein the software executed by the processor includes stitched software which formats significant digits of the number being formatted with commas before all zeros to the left of a decimal point of the number being formatted are written.

20. The computer-readable storage of claim 14, wherein the software executed by the processor writes a sign and then adjusts an output pointer regardless of whether the sign remains in the formatted number.

* * * * *